(12) United States Patent
Miyake

(10) Patent No.: US 10,234,983 B2
(45) Date of Patent: Mar. 19, 2019

(54) INPUT/OUTPUT PANEL, INPUT/OUTPUT DEVICE, AND DATA PROCESSOR

(71) Applicant: SEMICONDUCTOR ENERGY LABORATORY CO., LTD., Atsugi-shi, Kanagawa-ken (JP)

(72) Inventor: Hiroyuki Miyake, Tochigi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/259,117

(22) Filed: Sep. 8, 2016

(65) Prior Publication Data
US 2017/0075475 A1 Mar. 16, 2017

(30) Foreign Application Priority Data
Sep. 11, 2015 (JP) ................. 2015-179183

(51) Int. Cl.
*G09G 3/3233* (2016.01)
*G06F 3/041* (2006.01)
*G06F 3/044* (2006.01)
*G02F 1/1333* (2006.01)
*H01L 27/32* (2006.01)

(52) U.S. Cl.
CPC ........ *G06F 3/0416* (2013.01); *G02F 1/13338* (2013.01); *G06F 3/044* (2013.01); *G06F 3/0412* (2013.01); *G09G 3/3233* (2013.01); *H01L 27/323* (2013.01); *G06F 2203/04103* (2013.01);
(Continued)

(58) Field of Classification Search
CPC ................. G06F 3/0416; G06F 3/0412; G06F 2203/04103; G09G 3/3233
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Shaheda A Abdin
(74) *Attorney, Agent, or Firm* — Nixon Peabody LLP; Jeffrey L. Costellia

(57) ABSTRACT

A novel input/output panel that is highly convenient or reliable is provided. In addition, a novel input/output device that is highly convenient or reliable is provided. The input/output panel includes a display element, a first conductive film, and a second conductive film. The first conductive film is electrically connected to a plurality of pixel circuits, and the second conductive film is provided so that an electric field which is partly interrupted by an object approaching on the display side of the display element is formed between the first conductive film and the second conductive film.

20 Claims, 17 Drawing Sheets

(52) U.S. Cl.
CPC ..... *G09G 2230/00* (2013.01); *G09G 2310/06* (2013.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,859,521 B2 | 12/2010 | Hotelling et al. |
| 7,920,129 B2 | 4/2011 | Hotelling et al. |
| 8,786,557 B2 | 7/2014 | Noguchi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0017710 A1 | 1/2006 | Lee et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0161051 A1 | 6/2009 | Fukunaga et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0245308 A1* | 9/2010 | Takei .................. G06F 3/0412 345/206 |
| 2010/0328239 A1 | 12/2010 | Harada et al. |
| 2012/0169400 A1* | 7/2012 | Liu ..................... G06F 3/0416 327/517 |
| 2012/0249454 A1* | 10/2012 | Teraguchi ............ G06F 3/0412 345/173 |
| 2013/0037798 A1 | 2/2013 | Wong et al. |
| 2014/0055412 A1 | 2/2014 | Teramoto |
| 2014/0063368 A1 | 3/2014 | Yamazaki et al. |
| 2014/0267159 A1 | 9/2014 | Miyazaki et al. |
| 2014/0340363 A1 | 11/2014 | Ikeda et al. |
| 2015/0255518 A1 | 9/2015 | Watanabe et al. |
| 2015/0261333 A1 | 9/2015 | Kaneyasu et al. |
| 2015/0301382 A1 | 10/2015 | Ishitani et al. |
| 2015/0301422 A1 | 10/2015 | Miyake et al. |
| 2015/0311260 A1 | 10/2015 | Senda et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-196023 A | 7/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2009-244956 A | 10/2009 |
| JP | 2011-197685 A | 10/2011 |

(56) References Cited

FOREIGN PATENT DOCUMENTS

| JP | 2015-005280 A | 1/2015 |
|---|---|---|
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17 22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2: Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and SC2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW'06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 55, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B. (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (JournaL of the Electrochemical Society), 2008, vol. 155, No. 12, pp. H1009-H1014.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

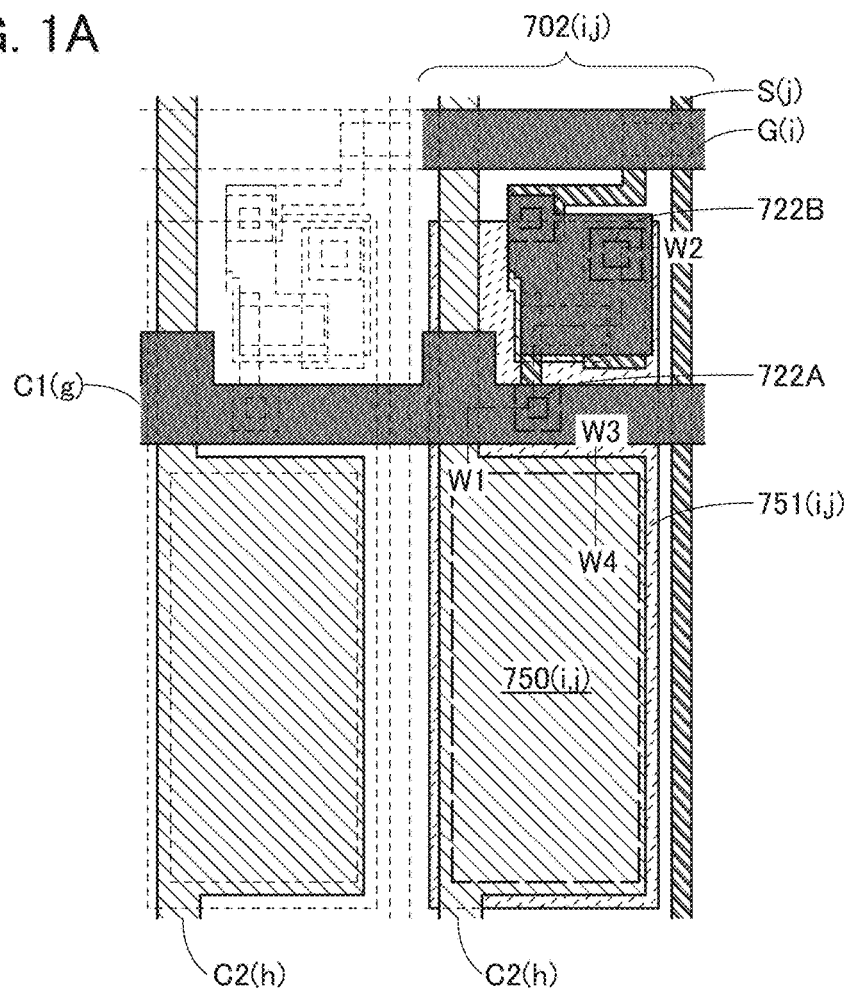
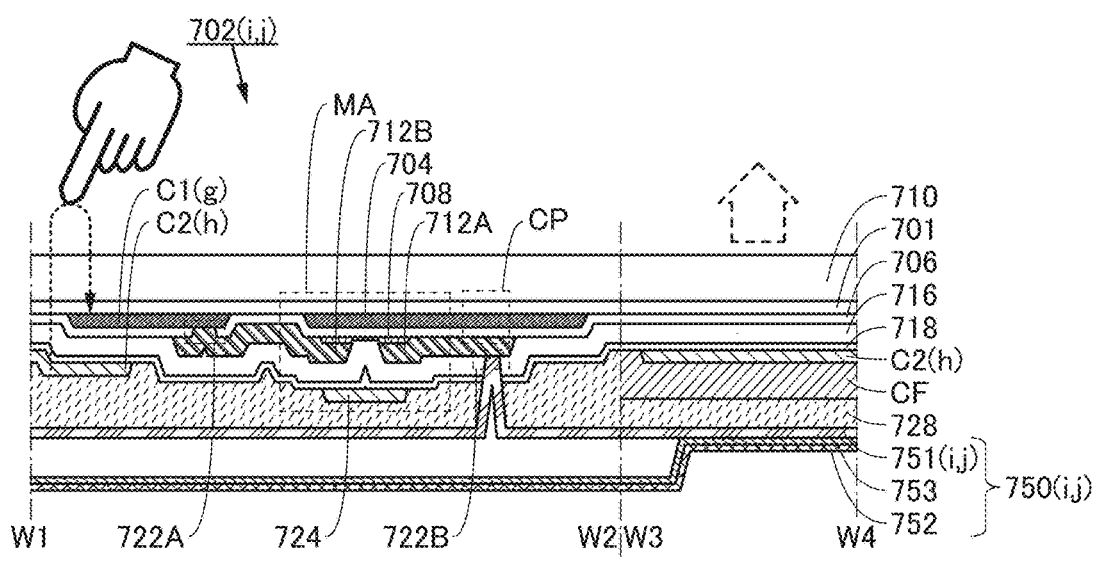

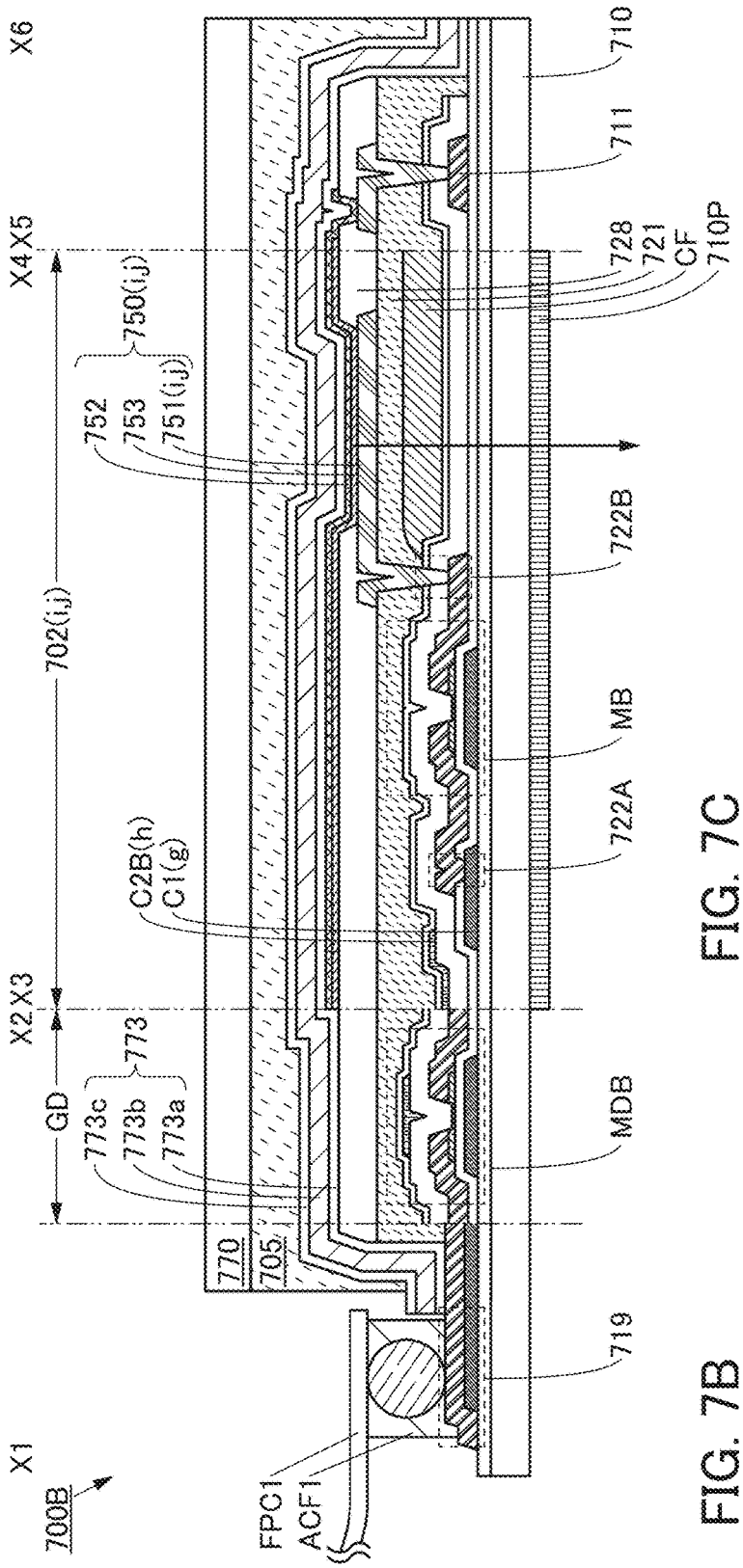

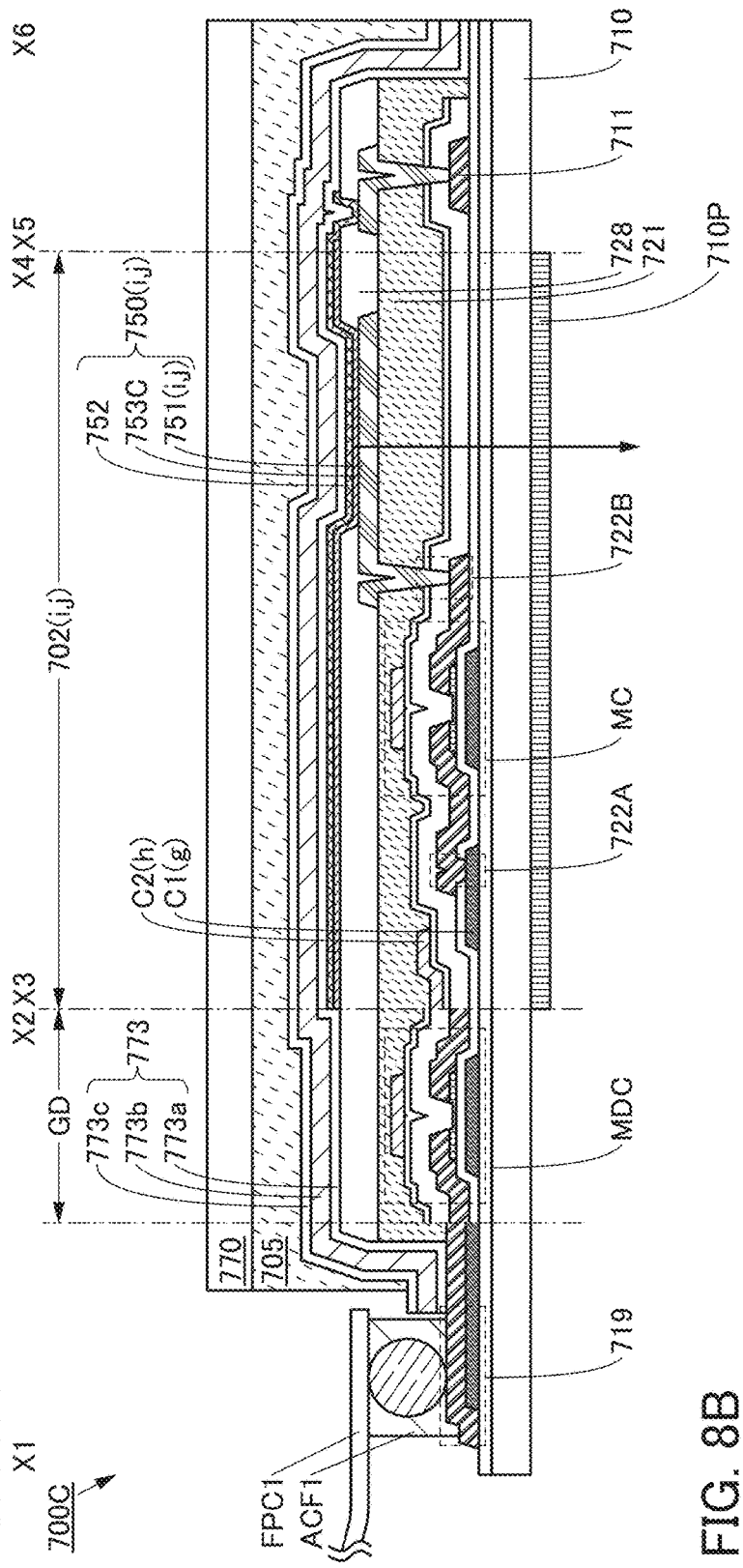

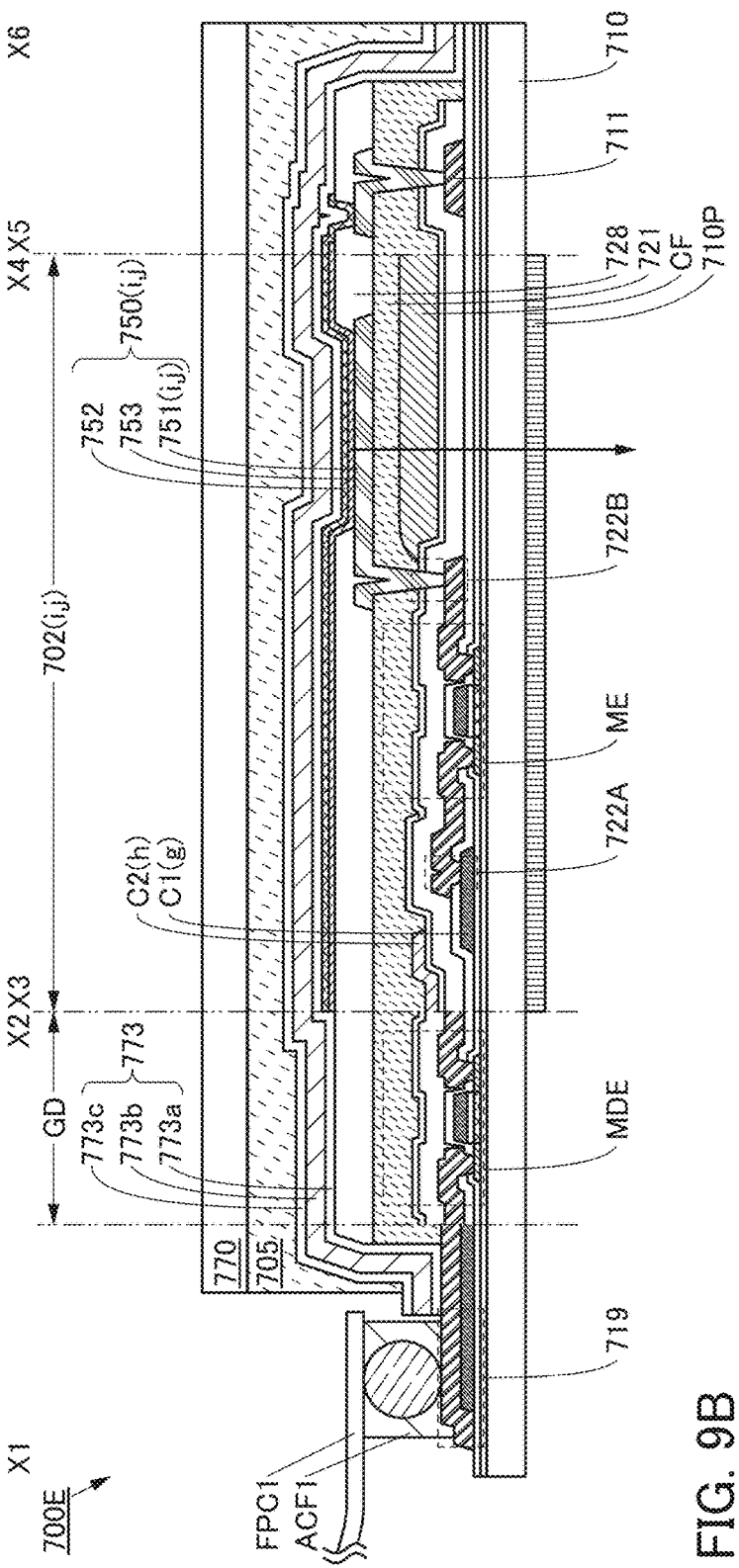
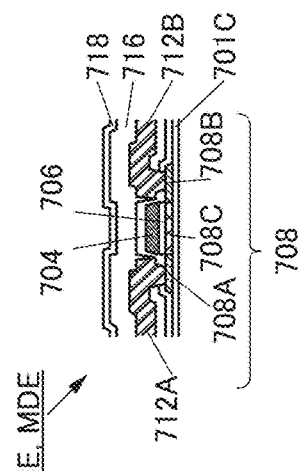
FIG. 9A
FIG. 9B

INPUT/OUTPUT PANEL, INPUT/OUTPUT DEVICE, AND DATA PROCESSOR

BACKGROUND OF THE INVENTION

1. Field of the Invention

One embodiment of the present invention relates to an input/output panel, an input/output device, a data processor, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

An imaging panel including a plurality of display pixels capable of displaying information and a photoelectric conversion element extending between the plurality of display pixels is known as an example of an optical touch panel (Patent Document 1).

In addition to the optical touch panel, a display device (or a display module) that is provided with a touch sensor as a position-input means has been put to practical use. A display device (or a display module) that is provided with a touch sensor can be called a touch panel, a touch screen, or the like (hereinafter, this type of display device may be simply referred to as a touch panel). Note that a device which does not include a display device and includes only a touch sensor is also called a touch panel in some cases. A display device that is provided with a touch sensor is also called a touch sensor equipped display device, a display device equipped touch panel, a display module, or the like in some cases. Furthermore, a display device in which a touch sensor is incorporated is called an in-cell touch sensor (or an in-cell touch sensor equipped display device), an on-cell touch sensor (or an on-cell touch sensor equipped display device), or the like in some cases. In the in-cell touch sensor, for example, an electrode used for a liquid crystal element is also used as an electrode for the touch sensor. In the on-cell touch sensor, for example, an electrode for the touch sensor is formed on the upper side (the side that is not provided with a display element) of a counter substrate. Examples of a portable information terminal provided with such a touch panel or the like include a smartphone and a tablet terminal (Patent Documents 2 and 3).

REFERENCE

Patent Document

[Patent Document 1] Japanese Published Patent Application No. 2015-005280
[Patent Document 2] Japanese Published Patent Application No. 2011-197685
[Patent Document 3] Japanese Published Patent Application No. 2009-244958

SUMMARY OF THE INVENTION

An object of one embodiment of the present invention is to provide a novel input/output panel that is highly convenient or reliable. Another object of one embodiment of the present invention is to provide a novel input/output device that is highly convenient or reliable. Another object of one embodiment of the present invention is to provide a novel data processor that is highly convenient or reliable. Another object of one embodiment of the present invention is to provide a novel input/output panel, a novel input/output device, a novel data processor, or a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is an input/output panel including a display element, a first conductive film, and a second conductive film.

The first conductive film is electrically connected to the display element. The second conductive film is provided so that an electric field which is partly interrupted by an object approaching a region overlapping with the display element is formed between the first conductive film and the second conductive film.

The display element includes a first electrode and a second electrode. The second electrode has a region overlapping with the first conductive film and a region overlapping with the second conductive film, and the first electrode has a region overlapping with the second electrode.

(2) One embodiment of the present invention is the input/output panel in which the second conductive film has a light-transmitting region in a region overlapping with the first electrode.

The input/output panel of one embodiment of the present invention includes the display element, and the first conductive film and the second conductive film which are arranged so that an electric field which is partly interrupted by an object approaching on the display side of the display element is formed therebetween. Accordingly, the potential of the conductive film is changed in accordance with the electric field which is interrupted by the approaching object. As a result, a novel input/output panel that is highly convenient or reliable can be provided.

(3) One embodiment of the present invention is the input/output panel which includes a pixel circuit, a scan line, and a signal line.

A plurality of pixel circuits are arranged in a row direction and another plurality of pixel circuits are arranged in a column direction intersecting with the row direction.

The scan line is electrically connected to the plurality of pixel circuits arranged in the row direction. The signal line is electrically connected to the plurality of pixel circuits arranged in the column direction.

The first conductive film is electrically connected to the plurality of pixel circuits arranged in the row direction and the plurality of pixel circuits arranged in the column direction.

The display element is electrically connected to the pixel circuits.

(4) One embodiment of the present invention is the input/output panel in which the first conductive film further includes a plurality of conductive films extending in the row direction.

The input/output panel of one embodiment of the present invention includes the display element, the first conductive film, and the second conductive film. The first conductive film is electrically connected to the plurality of pixel circuits, and the second conductive film is provided so that an electric field which is partly interrupted by an object approaching on the display side of the display element is formed between the first conductive film and the second conductive film. Accordingly, it is possible to sense the object approaching on the display side of the display element and identify the position. Moreover, it is possible to display an image whose definition is higher than definition at which the position of the approaching object is sensed. As a result, a novel input/output panel that is highly convenient or reliable can be provided.

(5) One embodiment of the present invention is the input/output panel in which the display element further includes a layer containing a light-emitting organic compound between the first electrode and the second electrode.

The first electrode has a light-transmitting region in a region overlapping with the second electrode, and the second electrode has a region interposing one of the first conductive film and the second conductive film between the other of the first conductive film and the second conductive film and the second electrode.

(6) One embodiment of the present invention is the input/output panel in which the pixel circuit includes a first transistor, a second transistor, and a capacitor.

The first transistor includes a gate electrode electrically connected to the scan line and a first electrode electrically connected to the signal line.

The second transistor includes a gate electrode electrically connected to a second electrode of the first transistor, a first electrode electrically connected to the first conductive film, and a second electrode electrically connected to the first electrode of the display element.

The capacitor includes a first electrode electrically connected to the gate electrode of the second transistor and a second electrode electrically connected to the second electrode of the second transistor.

The input/output panel of one embodiment of the present invention includes the display element, and the first conductive film and the second conductive film which are arranged so that an electric field which is partly interrupted by an object approaching on the display side of the display element is formed therebetween. Accordingly, it is possible to sense the approaching object. Moreover, it is possible to supply power to the display element with the first conductive film. As a result, a novel input/output panel that is highly convenient or reliable can be provided.

(7) One embodiment of the present invention is the input/output panel in which the transistor contains indium, gallium, zinc, and oxygen.

(8) One embodiment of the present invention is the input/output panel in which the second conductive film contains indium, gallium, zinc, and oxygen.

The input/output panel of one embodiment of the present invention includes the display element, and the first conductive film and the second conductive film which are arranged so that an electric field which is partly interrupted by an object approaching on the display side of the display element is formed therebetween. Accordingly, it is possible to sense the approaching object. Moreover, it is possible to form the second conductive film by utilizing a process of manufacturing part of the transistor. As a result, a novel input/output panel that is highly convenient or reliable can be provided.

(9) One embodiment of the present invention is an input/output device including the input/output panel and a driver circuit.

The driver circuit is electrically connected to the input/output panel.

The driver circuit is configured to supply a search signal to one of the first conductive film and the second conductive film. The driver circuit is configured to generate a sensor signal on the basis of a potential supplied from the other of the first conductive film and the second conductive film.

The input/output device of one embodiment of the present invention includes the input/output panel which is configured to receive the search signal and supply a potential that is changed in accordance with an electric field which is partly interrupted by the approaching object, and the driver circuit is configured to supply the search signal and generate the sensor signal on the basis of the supplied potential. Accordingly, it is possible to sense the approaching object with the potential that is changed in accordance with the electric field which is partly interrupted by the approaching object. As a result, a novel input/output device that is highly convenient or reliable can be provided.

(10) One embodiment of the present invention is a data processor including an arithmetic device and the input/output device.

The arithmetic device is configured to receive positional data and external data and supply image data and control data.

The input/output device is configured to supply the positional data and the external data and receive the image data and the control data.

The arithmetic device is further configured to generate the image data on the basis of the external data and determine and supply the control data on the basis of the positional data.

The input/output device further includes a display portion, an input portion, and a communication portion. The display portion is configured to display the image data, the input portion is configured to supply the positional data, and the communication portion is configured to receive the external data and send the control data.

(11) One embodiment of the present invention is the data processor in which an input portion includes at least one of a keyboard, a hardware button, a pointing device, a touch sensor, an illuminance sensor, an imaging device, an audio input device, a viewpoint input device, and a pose detection device.

Owing to the structure, for example, image data is generated on the basis of external data received from an external device and can be displayed on the display portion. Control data is determined on the basis of positional data supplied using the input portion and can be sent. Thus, a novel data processor that is highly convenient or reliable can be provided.

Although the block diagram attached to this specification shows components classified by their functions in independent blocks, it is difficult to classify actual components according to their functions completely and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Note that in this specification, a "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

Note that in this specification, a state in which transistors are connected to each other in series means, for example, a state in which only one of a source and a drain of a first transistor is connected to only one of a source and a drain of a second transistor. In addition, a state in which transistors are connected parallel to each other means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, a connection state means not only a state of direct connection but also a state of indirect connection through a circuit element such as a wiring, a resistor, a diode, or a transistor that allows current, voltage, or a potential to be supplied or transmitted.

In this specification, even when different components are connected to each other in a circuit diagram, there is actually a case where one conductive film has functions of a plurality of components such as a case where part of a wiring serves as an electrode. The term "connection" in this specification also means such a case where one conductive film has functions of a plurality of components.

In addition, in this specification, one of a first electrode and a second electrode of a transistor refers to a source electrode and the other refers to a drain electrode.

One embodiment of the present invention can provide a novel input/output panel that is highly convenient or reliable. One embodiment of the present invention can provide a novel input/output device that is highly convenient or reliable. One embodiment of the present invention can provide a novel data processor that is highly convenient or reliable. One embodiment of the present invention can provide a novel input/output panel, a novel input/output device, a novel data processor, or a novel semiconductor device.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 1A and 1B illustrate the structure of an input/output panel of one embodiment.
FIGS. 7A to 7C are cross-sectional views illustrating the structure of an input/output device of one embodiment.
FIGS. 8A and 8B are cross-sectional views illustrating the structure of an input/output device of one embodiment.
FIGS. 9A and 9B are cross-sectional views illustrating the structure of an input/output device of one embodiment.

DETAILED DESCRIPTION OF THE INVENTION

Figure 2A:
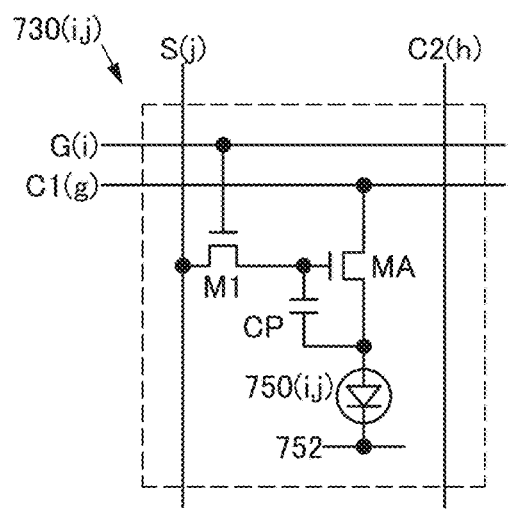
FIGS. 2A and 2B illustrate the structure of an input/output panel of one embodiment.

An input/output panel of one embodiment of the present invention includes a display element, a first conductive film, and a second conductive film. The first conductive film is electrically connected to a plurality of pixel circuits, and the second conductive film is provided so that an electric field which is partly interrupted by an object approaching on the display side of the display element is formed between the first conductive film and the second conductive film.

Accordingly, it is possible to sense the object approaching on the display side of the display element and identify the position. Moreover, it is possible to display an image at a higher resolution than the sensed position of the approaching object. As a result, a novel input/output panel that is highly convenient or reliable can be provided.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Embodiment 1

In this embodiment, the structure of an input/output panel of one embodiment of the present invention will be described with reference to FIGS. 1A and 1B, FIGS. 2A and 2B, and FIGS. 3A and 3B.

FIGS. 1A and 1B illustrate the structure of an input/output panel 700P of one embodiment of the present invention.

FIG. 1A is a top view of the input/output panel of one embodiment of the present invention. FIG. 1B is a cross-sectional view taken along the section lines W1-W2 and W3-W4 in FIG. 1A.

Figure 2B:
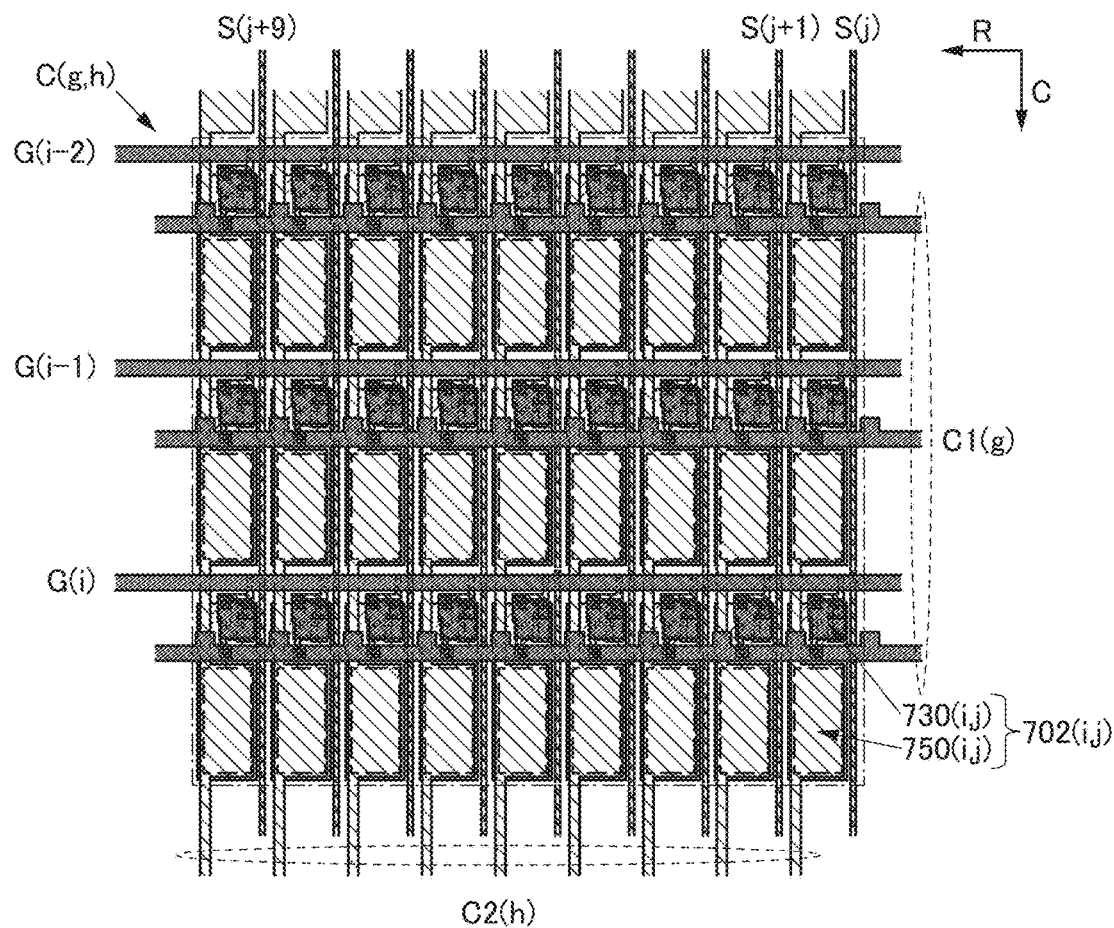

FIGS. 2A and 2B illustrate the structure of the input/output panel 700P of one embodiment of the present invention. FIG. 2A is a circuit diagram illustrating a pixel circuit 730(i, j) that can be used for the input/output panel 700P of one embodiment of the present invention, and FIG. 2B is a top view of the input/output panel 700P of one embodiment of the present invention.

Figure 3A:
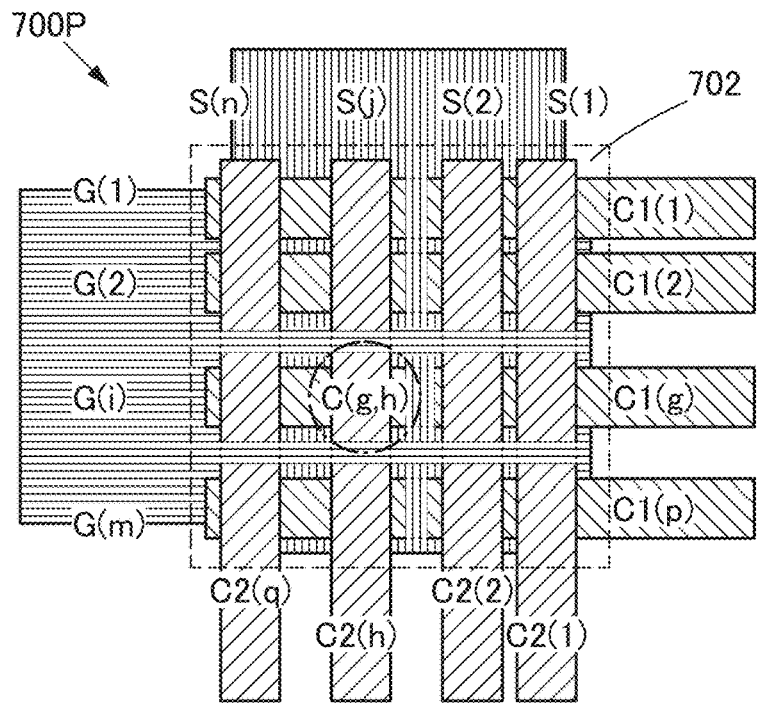
FIGS. 3A and 3B illustrate the structures of an input/output panel and an input/output device of one embodiment.
Figure 3B:
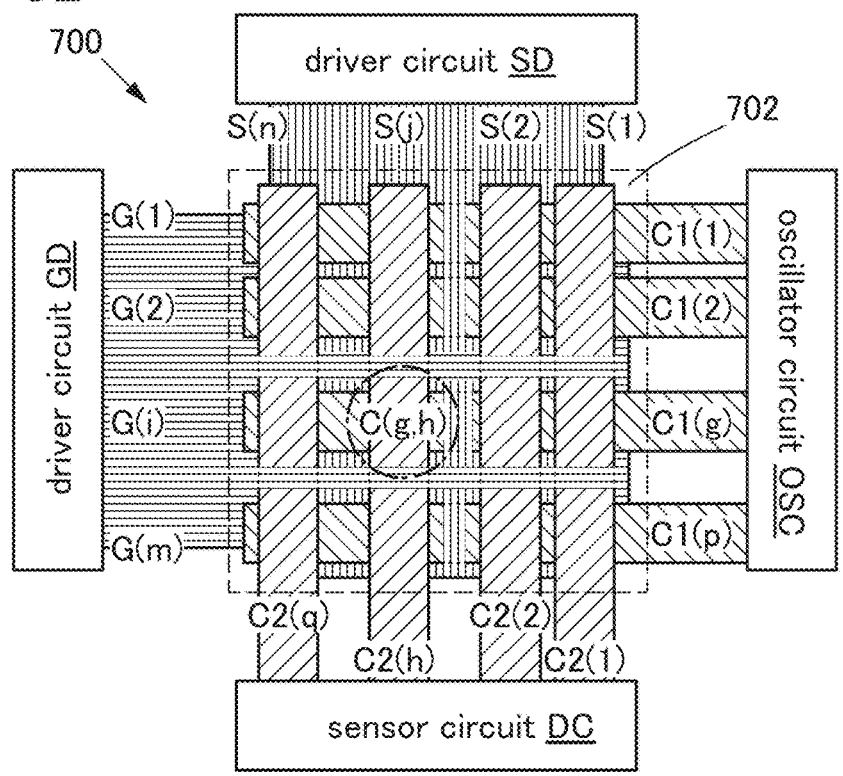

FIGS. 3A and 3B are schematic views illustrating the structures of the input/output panel and an input/output device of one embodiment of the present invention. FIGS. 3A and 3B are the schematic views illustrating the structures of the input/output panel 700P and an input/output device 700 of one embodiment of the present invention, respectively.

Note that FIG. 2B illustrates the structure of an intersection portion C(g, h) illustrated in FIG. 3A.

FIG. 1A illustrates the structure of a pixel 702(i, j) illustrated in FIG. 2B. Note that the right side of FIG. 1A illustrates the structure of the pixel 702(i, j), and the left side of FIG. 1A illustrates the arrangement of a first conductive film C1(g) and a second conductive film C2(h).

Note that in this Specification, an Integral Variable of 1 or More May be Used for reference numerals. For example, "(p)" where p is an integral variable of 1 or more may be used for part of a reference numeral that specifies any one of components (p components in maximum). For another example, "(m, n)" where m and n are each an integral variable of 1 or more may be used for part of a reference numeral that specifies any one of components (m×n components in maximum).

<Structure Example 1 of Input/Output Panel>

The input/output panel 700P described in this embodiment includes a display element 750(i, j), the first conductive film C1(g), and the second conductive film C2(h) (see FIG. 1A).

The first conductive film C1(g) is electrically connected to the display element 750(i, j) (see FIG. 1B). For example, the first conductive film C1(g) is electrically connected to a first electrode of a transistor MA in a connection portion 722A, and a second electrode of the transistor MA is electrically connected to a first electrode 751(1, j) of the display element 750 (i, j) in a connection portion 722B.

The second conductive film C2(h) is provided so that an electric field which is partly interrupted by an object approaching from a direction facing the display direction of the display element 750 (i, j) (shown by a large arrow in the drawing) is formed between the first conductive film C1(g) and the second conductive film C2(h). For example, the second conductive film C2(h) extending in the column direction is provided so as to intersect with the first conductive film C1(g) extending in the row direction. Accordingly, the electric field which is partly interrupted by the approaching object (shown by a dashed line arrow in the drawing) is formed in the vicinity of an intersection region (see FIG. 1B).

The display element 750(i, j) includes the first electrode 751(i, j) and a second electrode 752.

The second electrode 752 has a region overlapping with the first conductive film C1(g) and a region overlapping with the second conductive film C2(h).

The first electrode 751(i, j) has a region overlapping with the second electrode 752.

The second conductive film C2(h) can have a light-transmitting region in a region overlapping with the first electrode 751(i, j) (see FIG. 1B).

The input/output panel described in this embodiment includes the display element, and the first conductive film and the second conductive film which are arranged so that an electric field which is partly interrupted by an object approaching on the display side of the display element is formed therebetween. Accordingly, the potential of the conductive film is changed in accordance with the electric field which is interrupted by the approaching object. As a result, a novel input/output panel that is highly convenient or reliable can be provided.

In addition, the input/output panel 700P described in this embodiment includes a plurality of pixel circuits, a plurality of scan lines, and a plurality of signal lines (see FIG. 2B). For example, the input/output panel 700P includes the pixel circuit 730(i, j), a scan line G(i), and a signal line S(j).

A plurality of pixel circuits are arranged in the row direction (a direction shown by an arrow R in the drawing). Another plurality of pixel circuit are also arranged in the column direction (a direction shown by an arrow C in the drawing) intersecting with the row direction.

The scan line G(i) is electrically connected to the plurality of pixel circuits arranged in the row direction.

The signal line S(j) is electrically connected to the plurality of pixel circuits arranged in the column direction.

The first conductive film C1(g) is electrically connected to the plurality of pixel circuits arranged in the row direction and the plurality of pixel circuits arranged in the column direction.

The display element 750(i, j) is electrically connected to the pixel circuit 730(i, j) (see FIG. 2A).

The first conductive film C1(g) of the input/output panel described in this embodiment includes a plurality of conductive films extending in the row direction (see FIG. 2B). For example, the first conductive film C1(g) includes three conductive films.

The input/output panel described in this embodiment includes the display element, the first conductive film, and the second conductive film. The first conductive film is electrically connected to the plurality of pixel circuits, and the second conductive film is provided so that an electric field which is partly interrupted by an object approaching on the display side of the display element is formed between the first conductive film and the second conductive film. Accordingly, it is possible to sense the object approaching on the display side of the display element and identify the position. Moreover, it is possible to display an image at a higher resolution than the sensed position of the approaching object. As a result, a novel input/output panel that is highly convenient or reliable can be provided.

In the display element 750(i, j) of the input/output panel described in this embodiment, a layer 753 containing a light-emitting organic compound is provided between the first electrode 751(i, j) and the second electrode 752 (see FIG. 1B).

The first electrode 751(i, j) has a light-transmitting region in a region overlapping with the second electrode 752.

The second electrode 752 has a region interposing one of the first conductive film C1(g) and the second conductive film C2(h) between the other thereof and the second electrode 752.

The pixel circuit 730(i, j) of the input/output panel described in this embodiment includes a first transistor M1, a second transistor MA, and a capacitor CP (see FIG. 2A).

The first transistor M1 includes a gate electrode electrically connected to the scan line G(i) and a first electrode electrically connected to the signal line S(j).

The second transistor MA includes a gate electrode electrically connected to a second electrode of the first transistor M1, a first electrode electrically connected to the first conductive film C1(g), and a second electrode electrically connected to a first electrode of the display element 750(i, j).

The capacitor CP includes a first electrode electrically connected to the gate electrode of the second transistor MA and a second electrode electrically connected to the second electrode of the second transistor MA.

The input/output panel described in this embodiment includes the display element, and the first conductive film and the second conductive film which are arranged so that an electric field which is partly interrupted by an object approaching on the display side of the display element is formed therebetween. Accordingly, it is possible to sense the approaching object. Moreover, it is possible to supply power to the display element with the first conductive film. As a result, a novel input/output panel that is highly convenient or reliable can be provided.

The input/output panel described in this embodiment includes first conductive films C1(1) to C1(p), and the first conductive film C1(g) is one selected from these first conductive films (see FIG. 3A).

The input/output panel described in this embodiment further includes second conductive films C2(1) to C2(q), and a second conductive film C2(g) is one selected from these second conductive films.

Note that p and q are each an integer of 1 or more, g is an integer of 1 or more and p or less, and h is an integer of 1 or more and q or less.

Further, the intersection portion C(g, h) at which the first conductive film C1(g) and the second conductive film C2(h) intersect with each other is provided. The intersection portion C(g, h) is provided with an insulating film between the first conductive film C1(g) and the second conductive film C2(h). Specifically, insulating films 706, 716, and 718 are provided.

The input/output panel 700P described in this embodiment includes pixels in a matrix of m rows and n columns. The pixel 702(i, j) is one selected from these pixels. Note that m and n are each an integer of 1 or more, i is an integer of 1 or more and m or less, and j is an integer of 1 or more and n or less (see FIG. 3B).

The pixel 702(i, j) includes the display element 750(i, j) and the pixel circuit 730(i, j) electrically connected to the display element 750(i, j) (see FIG. 2A).

The input/output panel 700P described in this embodiment includes scan lines arranged in m rows. The scan line G(i) is one selected from these scan lines and is electrically connected to pixels 702(i, 1) to 702(i, n).

The input/output panel 700P described in this embodiment includes signal lines arranged in n columns. The signal line S(j) is one selected from these signal lines and is electrically connected to pixels 702(1, j) to 702(m, j).

The input/output panel 700P described in this embodiment includes a base 710, an insulating film 728, a coloring film CF, the insulating films 716 and 718, the transistor MA, a conductive film 724, and an insulating film 701.

The insulating film 728 is provided between the display element 750(i, j) and the base 710.

The coloring film CF is provided between the display element 750(i, j) and the base 710.

The insulating films 716 and 718 are provided between the coloring film CF and the base 710.

The transistor MA is provided between the insulating film 718 and the base 710.

The insulating film 701 is provided between the transistor MA and the base 710.

A semiconductor film 708 is interposed between the conductive film 724 and a conductive film 704.

Components constituting the input/output panel will be described below.

Note that the components cannot be clearly distinguished from one another and one component serves as another component or includes part of another component in some cases.

For example, the first conductive film C1(g) is an electrode that forms a proximity sensor and also a wiring that supplies power to the display element 750(i, j).

<<Structure>>

The input/output panel of one embodiment of the present invention includes the display element 750(i, j), the first conductive film C1(g), the second conductive film C2(h), the first electrode 751(i, j), the second electrode 752, the pixel circuit 730(i, j), the scan line G(i), or the signal line S(j).

The input/output panel of one embodiment of the present invention includes the insulating film 706, 716, 718, 728, or 701.

The input/output panel of one embodiment of the present invention includes the base 710, the coloring film CF, the conductive film 724, or the transistor MA.

<<Base 710>>

A material having heat resistance high enough to withstand heat treatment in the manufacturing process can be used for the base 710.

For example, a large-sized glass substrate having any of the following sizes can be used as the base 710: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the base 710, an organic material, an inorganic material, a composite material of an organic material and an inorganic material, or the like can be used. For example, an inorganic material such as glass, ceramic, or a metal can be used for the base 710.

Specifically, non-alkali glass, soda-lime glass, potash glass, crystal glass, quartz, sapphire, or the like can be used for the base 710. Specifically, an inorganic oxide film, an inorganic nitride film, an inorganic oxynitride film, or the like can be used for the base 710. For example, a silicon oxide film, a silicon nitride film, a silicon oxynitride film, or an alumina film can be used for the base 710. For example, stainless steel or aluminum can be used for the base 710.

For example, a single crystal semiconductor substrate or a polycrystalline semiconductor substrate of silicon or silicon carbide, a compound semiconductor substrate of silicon germanium or the like, or an SOI substrate can be used as the base 710. Thus, a semiconductor element can be provided over the base 710.

For example, an organic material such as a resin, a resin film, or plastic can be used for the base 710. Specifically, a resin film or resin plate of polyester, polyolefin, polyamide, polyimide, polycarbonate, an acrylic resin, or the like can be used for the base 710.

For example, a composite material formed by attaching a metal plate, a thin glass plate, or a film of an inorganic material to a resin film or the like can be used for the base 710. For example, a composite material formed by dispersing a fibrous or particulate metal, glass, inorganic material, or the like into a resin film can be used for the base 710. For example, a composite material formed by dispersing a fibrous or particulate resin, an organic material, or the like into an inorganic material can be used for the base 710.

Furthermore, a single-layer material or a material obtained by stacking a plurality of layers can be used for the base 710. For example, a material obtained by stacking a base, an insulating film that prevents diffusion of impurities contained in the base, and the like can be used for the base 710. Specifically, a material obtained by stacking glass and one or a plurality of films that are selected from a silicon oxide layer, a silicon nitride layer, a silicon oxynitride layer, and the like and that prevent diffusion of impurities contained in the glass can be used for the base 710. Alternatively, a material obtained by stacking a resin and a film for preventing diffusion of impurities that penetrate the resin, such as a silicon oxide film, a silicon nitride film, and a silicon oxynitride film can be used for the base 710.

Specifically, a resin film, a resin plate, a stack, or the like of polyester, polyolefin, polyamide, polyimide, polycarbonate, an acrylic resin, or the like can be used for the base 710.

Specifically, a material including polyester, polyolefin, polyamide (e.g., nylon or aramid), polyimide, polycarbonate, an acrylic resin, a urethane resin, an epoxy resin, a resin having a siloxane bond such as silicone, or the like can be used for the base 710.

Specifically, polyethylene terephthalate (PET), polyethylene naphthalate (PEN), polyethersulfone (PES), acrylic, or the like can be used for the base 710.

Alternatively, paper, wood, or the like can be used for the base 710.

For example, a flexible substrate can be used as the base 710.

Note that a transistor, a capacitor, or the like can be directly formed on the base 710. Alternatively, a transistor, a capacitor, or the like formed on a substrate for use in manufacturing processes which can withstand heat applied in the manufacturing process can be transferred to the base 710. Thus, a transistor, a capacitor, or the like can be formed over a flexible substrate, for example.

<<First Conductive Film C1($g$), Second Conductive Film C2($h$), or Conductive Film 724>>

The first conductive film C1($g$), the second conductive film C2($h$), or the conductive film 724 can be formed using a conductive material.

For example, the first conductive film C1($g$), the second conductive film C2($h$), or the conductive film 724 can be formed using an inorganic conductive material, an organic conductive material, a metal, conductive ceramics, or the like.

Specifically, a metal element selected from aluminum, gold, platinum, silver, copper, chromium, tantalum, titanium, molybdenum, tungsten, nickel, iron, cobalt, palladium, and manganese, or the like can be used for the first conductive film C1($g$), the second conductive film C2($h$), or the conductive film 724. Alternatively, an alloy including any of the above-described metal elements, or the like can be used for the first conductive film C1($g$), the second conductive film C2($h$), or the conductive film 724. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used for the first conductive film C1($g$), the second conductive film C2($h$), or the conductive film 724.

Specifically, a conductive oxide such as indium oxide, indium tin oxide, indium zinc oxide, zinc oxide, or zinc oxide to which gallium is added can be used for the first conductive film C1($g$), the second conductive film C2($h$), or the conductive film 724.

Specifically, an oxide semiconductor film whose resistivity is controlled using a method described later can be used for the first conductive film C1($g$), the second conductive film C2($h$), or the conductive film 724.

For example, a film containing graphene or graphite can be used for the first conductive film C1($g$), the second conductive film C2($h$), or the conductive film 724.

Specifically, a film including graphene oxide is formed and is reduced, so that a film including graphene can be formed. As a reducing method, a method using heat, a method using a reducing agent, or the like can be employed.

For example, a conductive polymer can be used for the first conductive film C1($g$), the second conductive film C2($h$), or the conductive film 724.

<<Scan Line G($i$) or Signal Line S($j$)>>

The scan line G($i$) or the signal line S($j$) can be formed using a conductive material, such as a material which can be used for the first conductive film C1($g$) or the second conductive film C2($h$).

<<First Electrode 751($i, j$) or Second Electrode 752>>

The first electrode 751($i, j$) or the second electrode 752 can be formed using a conductive material, such as a material which can be used for the first conductive film C1($g$) or the second conductive film C2($h$), for example.

<<Insulating Film 706, 716, 718, 728, or 701>>

For example, an inorganic insulating material, an organic insulating material, or a composite insulating material containing an inorganic material and an organic material can be used for the insulating film 706, 716, 718, 728, or 701.

Specifically, an inorganic oxide film, an inorganic nitride film, an inorganic oxynitride film, or a material obtained by stacking any of these films can be used for the insulating film 706, 716, 718, 728, or 701. For example, a silicon oxide film, a silicon nitride film, a silicon oxynitride film, or a material obtained by stacking any of these films can be used.

Specifically, polyester, polyolefin, polyamide, polyimide, polycarbonate, polysiloxane, an acrylic resin, or a stacked or composite material including resins selected from these, or the like can be used for the insulating film 706, 716, 718, 728, or 701. A photosensitive material may be used.

For example, the insulating film 728 can be formed of polyimide, an epoxy resin, an acrylic resin, or the like.

<<Display Element 750($i, j$)>>

For example, a display element having a function of controlling reflection of light, a display element having a function of controlling transmission of light, a light-emitting element, or the like can be used as the display element 750($i, j$).

Specifically, a combined structure of a polarizing plate and a liquid crystal element, a MEMS shutter display element, or the like can be used for the display element 750($i, j$).

<<Layer 753 Containing Light-Emitting Organic Compound>>

A layer containing an organic compound which emits fluorescence or light obtained through a triplet excited state can be used as the layer 753 containing a light-emitting organic compound.

A structure of a single layer or stacked layers can be used for the layer 753 containing a light-emitting organic compound.

For example, a layer including a material with a higher hole-transport property than an electron-transport property, a layer including a material with a higher electron-transport property than a hole-transport property, or the like can be used.

For example, a structure of stacked layers for emitting white light can be used for the layer 753 containing a light-emitting organic compound.

For example, a plurality of layers 753 containing light-emitting organic compounds with different compositions can be used in one input/output panel.

Specifically, the input/output panel can include a layer containing a red light-emitting organic compound, a layer containing a green light-emitting organic compound, and a layer containing a blue light-emitting organic compound.

<<Coloring Film CF>>

The coloring film CF can be formed using a material transmitting light of a predetermined color and can thus be used as a color filter, for example.

For example, the coloring film CF can be formed using a material transmitting light of blue, green, red, yellow, or white.

<<Pixel Circuit 730(i, j)>>

For example, a pixel circuit having a function of being electrically connected to the scan line G(i), the signal line S(j), and the first conductive film C1(g) and a function of driving the display element 750(i, j) can be used as the pixel circuit 730(i, j).

A switch, a capacitor, or the like can be used in the pixel circuit 730(i, j). In addition, a transistor, a diode, a resistor, a capacitor, or an inductor can be used, for example.

For example, one or a plurality of transistors can be used as a switch. Alternatively, a plurality of transistors connected in parallel, in series, or in combination of parallel connection and series connection can be used as a switch.

For example, a capacitor may be formed by the first electrode 751(i, j) of the display element 750(i, j) and a conductive film having a region overlapping with the first electrode 751(i, j).

<<Transistor M1 or MA>>

As the transistor M1 or MA, a bottom-gate transistor, a top-gate transistor, or the like can be used.

For example, a transistor in which a semiconductor containing an element of Group 14 is used for a semiconductor film can be used. Specifically, a semiconductor containing silicon can be used for the semiconductor film. For example, single crystal silicon, polysilicon, microcrystalline silicon, or amorphous silicon can be used for the semiconductor film of the transistor.

For example, a transistor in which an oxide semiconductor is used for a semiconductor film can be used. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used as the transistor M1 or MA. Specifically, a transistor in which an oxide semiconductor is used for the semiconductor film 708 can be used as the transistor M1 or MA.

Thus, a pixel circuit in the transistor that uses an oxide semiconductor for the semiconductor film can hold an image signal for a longer time than a pixel circuit in a transistor that uses amorphous silicon for a semiconductor film. Specifically, a selection signal can be supplied at a frequency of lower than 30 Hz, preferably lower than 1 Hz and further preferably less than once per minute while flickering is suppressed. Consequently, eyestrain on a user of the data processor can be reduced, and power consumption for driving can be reduced.

The transistor MA includes the semiconductor film 708 and the conductive film 704 having a region overlapping with the semiconductor film 708 (see FIG. 1B). The transistor MA further includes conductive films 712A and 712B.

Note that the conductive film 704 and the insulating film 706 function as a gate electrode and a gate insulating film, respectively. The conductive film 712A functions as one of a source electrode and a drain electrode, and the conductive film 712B functions as the other of the source electrode and the drain electrode.

<<Capacitor CP>>

For example, the stacked-layer structure of the conductive film 704, the conductive film 712A having a region overlapping with the conductive film 704, and the insulating film 706 provided between the conductive film 704 and the conductive film 712A can be used for the capacitor CP (see FIG. 1B).

<Method for Controlling Resistivity of Oxide Semiconductor>

The method for controlling the resistivity of an oxide semiconductor film will be described.

An oxide semiconductor film with a certain resistivity can be used as the semiconductor film 708, the first conductive film C1(g), the second conductive film C2(h), or the conductive film 724.

For example, a method for controlling the concentration of impurities such as hydrogen and water contained in the oxide semiconductor film and/or the oxygen vacancies in the film can be used as the method for controlling the resistivity of an oxide semiconductor film.

Specifically, plasma treatment can be used as a method for increasing or decreasing the concentration of impurities such as hydrogen and water and/or the oxygen vacancies in the film.

Specifically, plasma treatment using a gas containing one or more kinds selected from a rare gas (He, Ne, Ar, Kr, or Xe), hydrogen, boron, phosphorus, and nitrogen can be employed. For example, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, or plasma treatment in a nitrogen atmosphere can be employed. Thus, the oxide semiconductor film can have a high carrier density and a low resistivity.

Alternatively, hydrogen, boron, phosphorus, or nitrogen is added to the oxide semiconductor film by an ion implantation method, an ion doping method, a plasma immersion ion implantation method, or the like, so that the oxide semiconductor film can have a low resistivity.

Alternatively, an insulating film containing hydrogen is formed in contact with the oxide semiconductor film, and the hydrogen is diffused from the insulating film to the oxide semiconductor film, so that the oxide semiconductor film can have a high carrier density and a low resistivity.

For example, an insulating film with a hydrogen concentration of greater than or equal to $1\times10^{22}$ atoms/cm$^3$ is formed in contact with the oxide semiconductor film, in which case hydrogen can be effectively supplied to the oxide semiconductor film. Specifically, a silicon nitride film can be used as the insulating film formed in contact with the oxide semiconductor film.

Hydrogen contained in the oxide semiconductor film reacts with oxygen bonded to a metal atom to be water, and an oxygen vacancy is formed in a lattice from which oxygen is released (or a portion from which oxygen is released). Due to entry of hydrogen into the oxygen vacancy, an electron serving as a carrier is generated in some cases. Furthermore, bonding of part of hydrogen to oxygen bonded to a metal atom causes generation of an electron serving as a carrier in some cases. Thus, the oxide semiconductor film can have a high carrier density and a low resistivity.

Specifically, an oxide semiconductor with a hydrogen concentration measured by secondary ion mass spectrometry (SIMS) of greater than or equal to $8\times10^{19}$ atoms/cm$^3$, preferably greater than or equal to $1\times10^{20}$ atoms/cm$^3$ and further preferably greater than or equal to $5\times10^{20}$ atoms/cm$^3$, can be suitably used for the first conductive film C1($g$), the second conductive film C2($h$), or the conductive film 724.

On the other hand, an oxide semiconductor with a high resistivity can be used for a semiconductor film where a channel of a transistor is formed. Specifically, such an oxide semiconductor can be suitably used for the semiconductor film 708.

For example, an insulating film containing oxygen, in other words, an insulating film capable of releasing oxygen, is formed in contact with an oxide semiconductor film, and the oxygen is supplied from the insulating film to the oxide semiconductor film, so that oxygen vacancies in the film or at the interface can be filled. Thus, the oxide semiconductor film can have a high resistivity.

For example, a silicon oxide film or a silicon oxynitride film can be used as the insulating film capable of releasing oxygen.

The oxide semiconductor film in which oxygen vacancies are filled and the hydrogen concentration is reduced can be referred to as a highly purified intrinsic or substantially highly purified intrinsic oxide semiconductor film. The term "substantially intrinsic" refers to the state in which an oxide semiconductor film has a carrier density of lower than $8\times10^{11}$/cm$^3$, preferably lower than $1\times10^{11}$/cm$^3$ and further preferably lower than $1\times10^{10}$/cm$^3$. A highly purified intrinsic or substantially highly purified intrinsic oxide semiconductor film has few carrier generation sources and thus can have a low carrier density. The highly purified intrinsic or substantially highly purified intrinsic oxide semiconductor film has a low density of defect states and accordingly can have a low density of trap states.

Furthermore, a transistor including the highly purified intrinsic or substantially highly purified intrinsic oxide semiconductor film has an extremely low off-state current; even when an element has a channel width of $1\times10^6$ μm and a channel length L of 10 μm, the off-state current can be lower than or equal to the measurement limit of a semiconductor parameter analyzer, that is, lower than or equal to $1\times10^{-13}$ A, at a voltage (drain voltage) between a source electrode and a drain electrode of from 1 V to 10 V.

The transistor in which a channel region is formed in the oxide semiconductor film that is a highly purified intrinsic or substantially highly purified intrinsic oxide semiconductor film can have a small change in electrical characteristics and high reliability.

Specifically, an oxide semiconductor whose hydrogen concentration measured by secondary ion mass spectrometry (SIMS) is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$, can be favorably used for a semiconductor film where a channel of a transistor is formed.

An oxide semiconductor film that has a higher hydrogen concentration and/or a larger number of oxygen vacancies and that has a lower resistivity than the semiconductor film 708 is used as the conductive film 724.

A film whose hydrogen concentration is twice or more, preferably ten times or more, the hydrogen concentration of the semiconductor film 708 can be used as the conductive film 724.

Moreover, a film whose resistivity is higher than or equal to $1\times10^{-8}$ times and lower than $1\times10^{-1}$ times the resistivity of the semiconductor film 708 can be used as the conductive film 724.

Specifically, a film whose resistivity is higher than or equal to $1\times10^{-3}$ Ωcm and lower than $1\times10^4$ Ωcm, preferably higher than or equal to $1\times10^{-3}$ Ωcm and lower than $1\times10^{-1}$ Ωcm, can be used as the conductive film 724.

This embodiment can be combined with any of the other embodiments in this specification as appropriate.

Embodiment 2

In this embodiment, the structure of an input/output device of one embodiment of the present invention will be described with reference to FIGS. 3A and 3B.

FIGS. 3A and 3B are schematic views illustrating the structures of the input/output panel and the input/output device of one embodiment of the present invention. FIGS. 3A and 3B are the schematic views illustrating the structures of the input/output panel and the input/output device of one embodiment of the present invention, respectively.

Note that the input/output device of one embodiment of the present invention is different from the input/output panel described with reference to FIG. 3A in that a driver circuit is included. Different structures will be described in detail below, and the above description is referred to for the other similar structures.

<Structure Example of Input/Output Device>

The input/output device 700 described in this embodiment includes the input/output panel 700P and a driver circuit (see FIG. 3B).

The driver circuit is electrically connected to the input/output panel 700P.

The driver circuit has a function of supplying a search signal to one of the first conductive film C1($g$) and the second conductive film C2($h$). The driver circuit has a function of generating a sensor signal on the basis of a potential supplied from the other of the first conductive film C1($g$) and the second conductive film C2($h$).

The input/output device of one embodiment of the present invention includes the input/output panel having a function of receiving the search signal and supplying a potential that is changed in accordance with an electric field which is partly interrupted by the approaching object, and the driver circuit has a function of supplying the search signal and generating the sensor signal on the basis of the supplied potential. Accordingly, it is possible to sense the approaching object with the potential that is changed in accordance with the electric field which is partly interrupted by the approaching object. As a result, a novel input/output device that is highly convenient or reliable can be provided.

The driver circuit provided in the input/output device described in this embodiment includes an oscillator circuit OSC and a sensor circuit DC.

The oscillator circuit OSC is electrically connected to the first conductive film $C1(g)$ and supplies a search signal. For example, a rectangular wave, a sawtooth wave, or a triangular wave can be used for the search signal.

The sensor circuit DC is electrically connected to the second conductive film $C2(h)$ and has a function of supplying a sensor signal in accordance with a change in the potential of the second conductive film $C2(h)$.

The input/output device described in this embodiment also includes a driver circuit GD. The driver circuit GD is electrically connected to the scan line $G(i)$ and has a function of supplying a selection signal.

The input/output device described in this embodiment also includes a driver circuit SD. The driver circuit SD is electrically connected to the signal line $S(j)$ and has a function of supplying an image signal.

Components constituting the input/output device will be described below. Note that the components cannot be clearly distinguished from one another and one component serves as another component or includes part of another component in some cases.

For example, the first conductive film $C1(g)$ is an electrode that forms a proximity sensor and also a wiring that supplies power to the display element $750(i, j)$.

<<Structure>>

The input/output device of one embodiment of the present invention includes the input/output panel or the driver circuit.

The input/output device of one embodiment of the present invention includes the oscillator circuit OSC, the sensor circuit DC, the driver circuit GD, or the driver circuit SD.

<<Input/Output Panel>>

For example, the input/output panel 700P described in Embodiment 1 can be used for the input/output device.

<<Driver Circuit>>

For example, the oscillator circuit OSC and the sensor circuit DC can be used as the driver circuit.

An oscillator circuit capable of generating a rectangular wave, a sawtooth wave, or a triangular wave can be used as the driver circuit, for example. Accordingly, a signal generated from such a driver circuit can be used as the search signal.

For example, an amplifier circuit capable of amplifying a change in the potential of the connected second conductive film $C2(h)$ can be used as the sensor circuit DC. Accordingly, the change of the potential of the second conductive film $C2(h)$ can be amplified and supplied as a sensor signal.

For example, a transistor or a capacitor can be used in the driver circuit.

Specifically, a transistor that can be used as the transistor MA can be used in the driver circuit. For example, a transistor having the same structure as the transistor MA can be used in the driver circuit. Alternatively, a transistor having a different structure from the transistor MA can be used in the driver circuit.

<<Driver Circuit GD>>

Any of a variety of sequential circuits, such as a shift register, can be used as the driver circuit GD.

For example, a transistor or a capacitor can be used in the driver circuit GD.

Specifically, a transistor that can be used as the transistor MA can be used in the driver circuit GD. For example, a transistor having the same structure as the transistor MA can be used in the driver circuit GD. Alternatively, a transistor having a different structure from the transistor MA can be used in the driver circuit GD.

<<Driver Circuit SD>>

For example, a transistor or a capacitor can be used in the driver circuit. Specifically, a structure that can be used in the driver circuit GD can be used in the driver circuit SD.

For example, an integrated circuit can be used in the driver circuit SD. Specifically, an integrated circuit formed over a silicon substrate can be used.

For example, a chip on glass (COG) method can be used to mount the driver circuit SD. Specifically, the driver circuit SD can be mounted on a pad which is electrically connected to the signal line $S(j)$, using an anisotropic conductive film.

This embodiment can be combined with any of the other embodiments in this specification as appropriate.

Embodiment 3

In this embodiment, a driving method of the input/output device of one embodiment of the present invention will be described with reference to FIGS. 2A and 2B, FIGS. 3A and 3B, FIG. 4, and FIG. 5.

Figure 4:
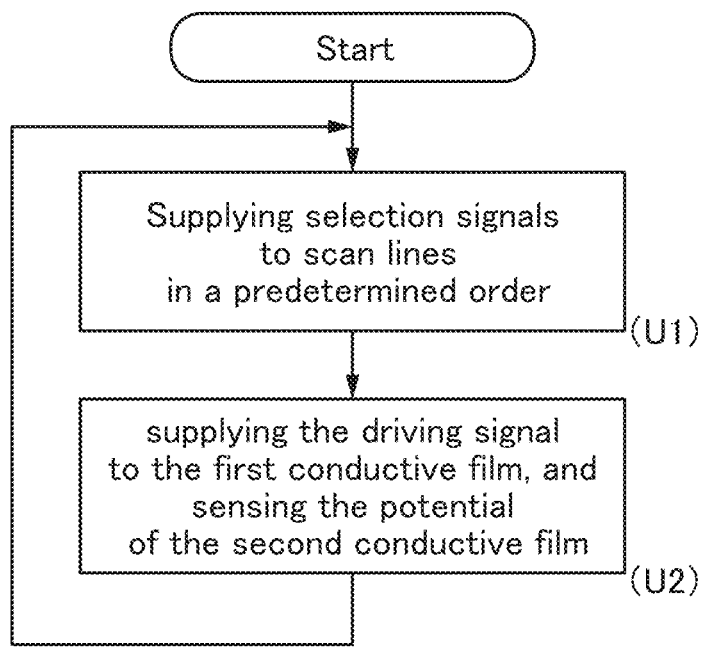
FIG. 4 is a flow chart showing a driving method of an input/output device of one embodiment.
Figure 5:
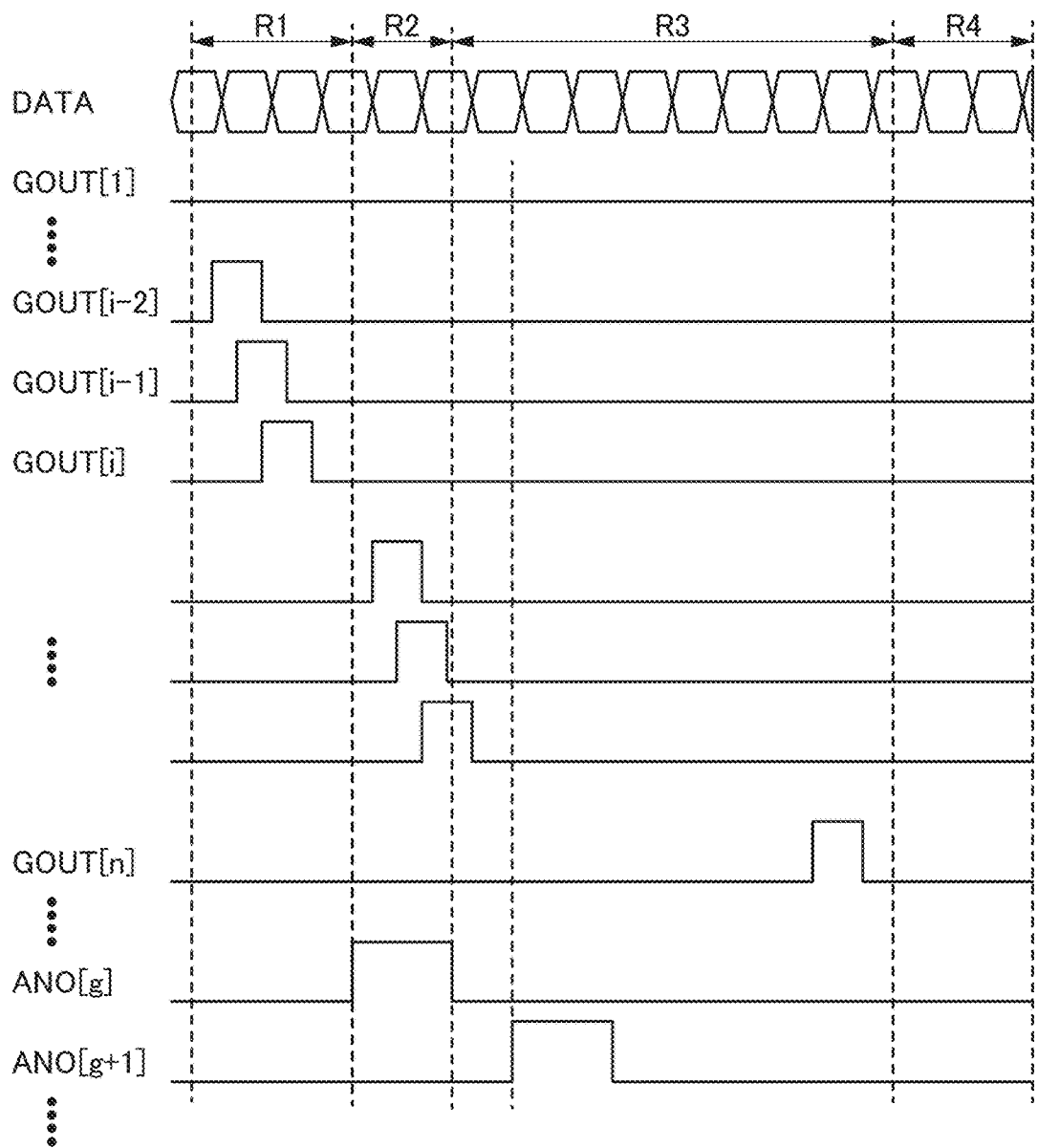
FIG. 5 is a timing chart showing a driving method of an input/output device of one embodiment.

FIG. 4 is a flow chart showing the driving method of the input/output device of one embodiment of the present invention. FIG. 5 is a timing chart showing the driving method of the input/output device of one embodiment of the present invention.

<Example of Driving Method of Input/Output Device>

A method for driving the input/output device described in this embodiment includes the following two steps (see FIG. 4).

In a first step, selection signals are supplied to scan lines in a predetermined order which are electrically connected to pixel circuits electrically connected to the first conductive film $C1(g)$ (see U1 in FIG. 4).

For example, in a period R1, a selection signal GOUT[i−2], a selection signal GOUT[i−1], and a selection signal GOUT[i] are respectively supplied to a scan line $G(i−2)$, a scan line $G(i−1)$, and a scan line $G(i)$ in a predetermined order (see FIG. 2B and FIG. 5). Accordingly, an image signal is written to each of the pixel circuits electrically connected to the scan lines $G(i−2)$ to $G(i)$.

In a second step, a search signal ANO[g] is supplied to the first conductive film $C1(g)$ and a change in the potential of the second conductive films having a region overlapping with the first conductive film $C1(g)$ is obtained as a sensor signal (see U2 in FIG. 4).

For example, in a period R2, a change in the potential of the second conductive films $C2(1)$ to $C2(q)$ is obtained as a sensor signal (see FIG. 3B).

The driving method of the input/output device described in this embodiment includes the first step and the second step. The first step is for supplying a selection signal to scan lines which are electrically connected to pixel circuits electrically connected to the first conductive film $C1(g)$, and the second step is for supplying a search signal to the first conductive film $C1(g)$ in a period during which the selection signal is not supplied.

The search signal ANO[g] is supplied to the first conductive film C1(g) in periods other than a period during which the selection signal is supplied to the pixel circuit, whereby the influence of the search signal ANO[g] on the image signal written in the period during which the selection signal is supplied can be reduced. In addition, an electric field that is interrupted and changed by an approaching object can be sensed using the potential of the second conductive film C2(h) and supplied as a sensor signal. As a result, a driving method of a novel input/output device that is highly convenient or reliable can be provided.

Note that in the case where g is less than n, for example, selection signals may be supplied to the scan lines in a predetermined order which are electrically connected to the pixel circuits electrically connected to the first conductive film C1(g+1) in the period R2. In other words, the following is possible: while selection signals are supplied to scan lines G(1) to G(n) in a predetermined order and image signals are written to the pixel circuits electrically connected to the scan lines, search signals are supplied to the first conductive films in which the image signals are written to all pixel circuits electrically connected to the scan lines. Accordingly, it is possible to display an image to the input/output device while the influence of the search signal ANO[g] on the image signal written in the period during which the selection signal is supplied is reduced. Moreover, it is possible to sense the position of an object approaching the input/output device.

Alternatively, for example, search signals ANO[1] to ANO[p] may be supplied to the first conductive films C1(1) to C1(p), after all the selection signals GOUT[1] to GOUT[n] are supplied to the scan lines G1(1) to G1(n) (e.g., after the period R3). In other words, the search signals ANO[1] to ANO[p] may be supplied to the first conductive films C1(1) to C1(p) in a vertical retrace period R4, respectively.

This embodiment can be combined with any of the other embodiments in this specification as appropriate.

Embodiment 4

In this embodiment, the structure of an input/output device of one embodiment of the present invention will be described with reference to FIG. 6, FIGS. 7A to 7C, FIGS. 8A and 8B, and FIGS. 9A and 9B.

Figure 6:
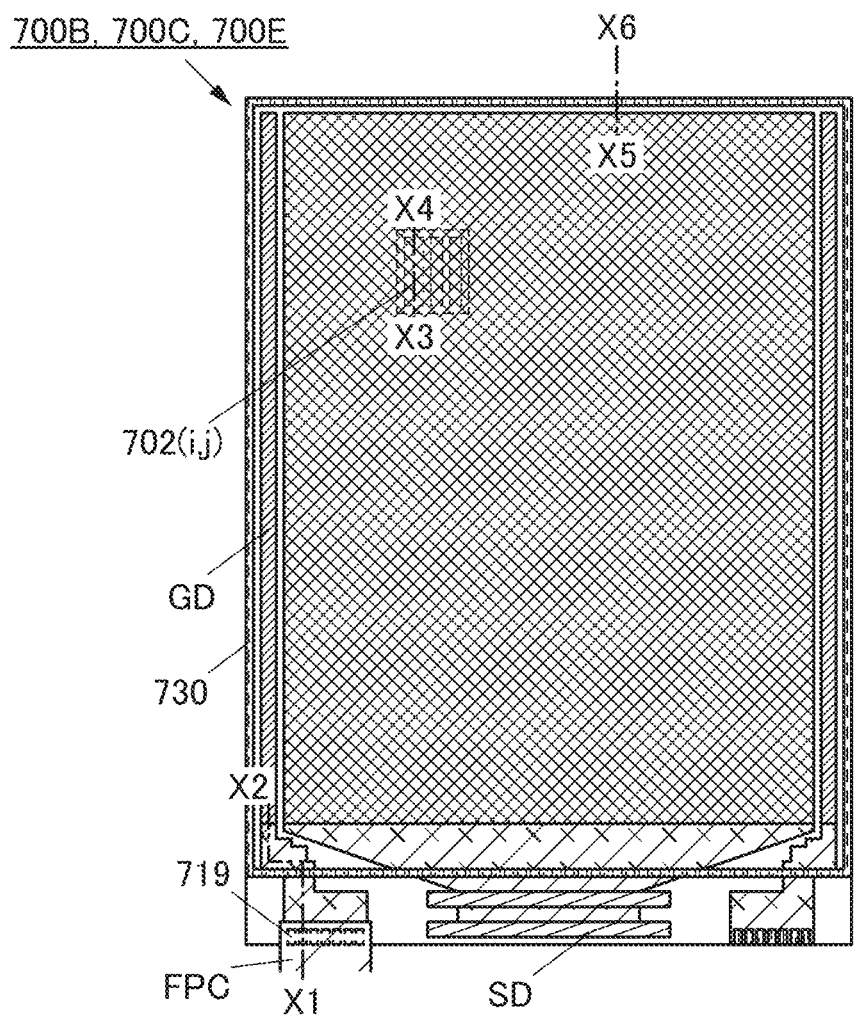
FIG. 6 illustrates the structure of an input/output device of one embodiment.

FIG. 6 is a bottom view illustrating the structure of an input/output device of one embodiment of the present invention.

FIGS. 7A to 7C illustrate the structure of an input/output device 700B of one embodiment of the present invention. FIG. 7A is a cross-sectional view of the input/output device 700B taken along the section lines X1-X2, X3-X4, and X5-X6 in FIG. 6. FIG. 7B is a cross-sectional view showing the detail of a transistor MB illustrated in FIG. 7A, and FIG. 7C is a cross-sectional view showing the detail of a transistor MDB illustrated in FIG. 7A.

<Structure Example 1 of Input/Output Device>

The input/output device 700B described in this embodiment includes the display element 750(i, j), the first conductive film C1(g), and a second conductive film C2B(h) (see FIG. 7A).

The first conductive film C1(g) is electrically connected to the display element 750(i, j). For example, the first conductive film C1(g) is electrically connected to a first electrode of the transistor MB in a connection portion 722A, and a second electrode of the transistor MB is electrically connected to the first electrode 751(i, j) of the display element 750 (i,j) in a connection portion 722B.

The second conductive film C2B(h) is provided so that an electric field which is partly interrupted by an object approaching a region overlapping with the display element 750 (i, j) is formed between the first conductive film C1(g) and the second conductive film C2B(h). For example, the second conductive film C2B(h) extending in the column direction is provided so as to intersect with the first conductive film C1(g) extending in the row direction. Accordingly, the electric field which is partly interrupted by the approaching object is formed in the vicinity of an intersection region.

The display element 750(i, j) includes the first electrode 751(i, j) and the second electrode 752.

The second electrode 752 has a region overlapping with the first conductive film C1(g) and a region overlapping with the second conductive film C2B(h).

The first electrode 751(i, j) has a region overlapping with the second electrode 752.

The input/output device 700B described in this embodiment includes the display element, the first conductive film, and the second conductive film. The first conductive film is electrically connected to a plurality of pixel circuits, and the second conductive film is provided so that an electric field which is partly interrupted by an object approaching on the display side of the display element is formed between the first conductive film and the second conductive film. Accordingly, it is possible to sense the object approaching on the display side of the display element and identify the position. Moreover, it is possible to display an image at a higher resolution than the sensed position of the approaching object. As a result, a novel input/output device that is highly convenient or reliable can be provided.

In the display element 750(i, j) of the input/output device 700B described in this embodiment, the layer 753 containing a light-emitting organic compound is provided between the first electrode 751(i,j) and the second electrode 752.

The first electrode 751(i, j) has a light-transmitting region in a region overlapping with the second electrode 752.

The second electrode 752 has a region interposing one of the first conductive film C1(g) and the second conductive film C2B(h) between the other thereof and the second electrode 752.

The input/output device 700B includes the base 710 and a base 770 including a region overlapping with the base 710. A bonding layer 705 is provided between the bases 710 and 770.

The input/output device 700B includes the insulating film 728 having an opening in a region overlapping with the display element 750(i,j).

The input/output device 700B includes an insulating film 721 between the display element 750(i, j) and the base 710.

The input/output device 700B includes the transistor MB between the insulating film 721 and the base 710.

The input/output device 700B includes the insulating film 718 between the insulating film 721 and the transistor MB and includes the insulating film 716 between the insulating film 718 and the transistor MB.

The transistor MB includes the semiconductor film 708, the conductive film 712A electrically connected to the semiconductor film 708, the conductive film 712B electrically connected to the semiconductor film 708, the conductive film 704 having a region overlapping with the semiconductor film 708 which is interposed between the conductive film 712A and the conductive film 704 and a region overlapping with the semiconductor film 708 which is interposed between the conductive film 712B and the conductive film 704, and the insulating film 706 between the semiconductor film 708 and the conductive film 704.

Note that the conductive film 704 functions as a gate electrode, the conductive film 712A functions as one of a source electrode and a drain electrode, and the conductive film 712B functions as the other of the source electrode and the drain electrode.

The input/output device 700B includes an insulating film 701C between the transistor MB and the base 710.

The input/output device 700B includes a conductive film 724B. The semiconductor film 708 is interposed between the conductive film 704 and a region of the conductive film 724B.

The input/output device 700B includes a conductive film 711 electrically connected to the display element 750($i, j$). The input/output device 700B includes a connection portion 719 electrically connected to the conductive film 711. The connection portion 719 is electrically connected to a flexible printed circuit FPC1 with a conductive material ACF1, for example.

The input/output device 700B can include a functional film 710P in a region overlapping with the display element 750($i,j$).

The input/output device 700B can include a coloring layer CF in a region overlapping with the display element 750($i, j$).

The input/output device 700B can include a protective film 773. The display element 750($i, j$) is partly interposed between the base 710 and the protective film 773. The protective film 773 can have a stacked-layer structure of protective films 773$a$, 773$b$, and 773$c$, for example.

The input/output device 700B can include the driver circuit GD electrically connected to the scan line G(i) and the driver circuit SD electrically connected to the signal line S(j) (see FIG. 6).

Structure Example 1

The input/output device of one embodiment of the present invention includes the first conductive film C1($g$), the second conductive film C2B($h$), the display element 750($i, j$), the first electrode 751($i, j$), the second electrode 752, or the layer 753 containing a light-emitting organic compound.

The input/output device of one embodiment of the present invention can include the base 710 or 770.

The input/output device of one embodiment of the present invention can include the conductive film 712A, 712B, 704, 724B, or 711, or the connection portion 719.

The input/output device of one embodiment of the present invention can include the insulating film 701C, 706, 716, 718, 721, or 728.

The input/output device of one embodiment of the present invention can include the bonding layer 705.

The input/output device of one embodiment of the present invention can include the functional film 710P, the coloring layer CF, or the protective film 773.

The input/output device of one embodiment of the present invention can include the transistor MB, the semiconductor film 708, the driver circuit GD, or the driver circuit SD.

<<Display Element 750($i, j$)>>

For example, the structure that can be used for the display element 750($i, j$) described in Embodiment 1 can be used for the display element 750($i, j$) described in this embodiment.

<<Layer 753 Containing Light-Emitting Organic Compound>>

For example, the structure that can be used for the layer 753 containing a light-emitting organic compound described in Embodiment 1 can be used for the layer 753 containing a light-emitting organic compound described in this embodiment.

Specifically, a structure of stacked layers for emitting white light can be used for the layer 753 containing a light-emitting organic compound.

<<First Electrode 751($i, j$) or Second Electrode 752>>

For example, the structure that can be used for the first electrode 751($i,j$) or the second electrode 752 described in Embodiment 1 can be used for the first electrode 751($i,j$) or the second electrode 752 described in this embodiment.

<<Base 710 or 770>>

A material having heat resistance high enough to withstand heat treatment in the manufacturing process can be used for the base 710 or 770. For example, the material that can be used for the base 710 described in Embodiment 1 can be used for the base 710 or 770 described in this embodiment.

A light-transmitting material can be used for the base 710.

<<Conductive Film 712A, 712B, 704, or 711, or Connection Portion 719>>

The conductive film 712A, 712B, 704, or 711 or the connection portion 719 can be formed using a conductive material, such as a material which can be used for the first conductive film C1($g$) or the second conductive film C2($h$) described in Embodiment 1, for example.

<<First Conductive Film C1($g$)>>

For example, the structure that can be used for the first conductive film C1($g$) described in Embodiment 1 can be used for the first conductive film C1($g$) described in this embodiment.

<<Conductive Film 724B and Second Conductive Film C2B(h)>>

For example, an oxide semiconductor whose conductivity is increased using a method for controlling the resistivity thereof can be used for the conductive film 724B and the second conductive film C2B(h).

Specifically, a conductive oxide such as indium oxide, indium tin oxide, indium zinc oxide, an oxide containing indium, gallium, and zinc, zinc oxide, or zinc oxide to which gallium is added can be used for the conductive film 724B and the second conductive film C2B(h).

For example, an oxide semiconductor and a hydrogen-diffusing material can be used respectively for the conductive film 724B and the insulating film 718 which is in contact with the conductive film 724B and the second conductive film C2B(h). Thus, the resistivity of the conductive film 724B and that of the second conductive film C2B(h) can be lowered.

<<Transistor MB or MDB>>

As the transistor MB or MDB, a bottom-gate transistor, a top-gate transistor, or the like can be used. For example, the structure that can be used for the transistor M1 or MA described in Embodiment 1 can be used for the transistor MB or MDB described in this embodiment.

For example, the structure that can be used for the semiconductor film 708 of the transistor M1 or MA described in Embodiment 1 can be used for the semiconductor film 708 of the transistor MB or MDB described in this embodiment.

<<Insulating Film 701C, 706, 716, 718, 721, or 728>>

For example, an inorganic insulating material, an organic insulating material, or a composite insulating material containing an inorganic material and an organic material can be used for the insulating film 701C, 706, 716, 718, 721, or 728. For example, the structure that can be used for the insulating film 706, 716, 718, 728, or 701 described in Embodiment 1 can be used for the insulating film 701C, 706, 716, 718, 721, or 728.

<<Protective Film 773>>

For example, an inorganic insulating material, an organic insulating material, or a composite insulating material containing an inorganic material and an organic material can be used for the protective film 773.

Specifically, an inorganic insulating material can be used for the protective films 773a and 773c, and an organic insulating material can be used for the protective film 773b. Thus, the protective film 773 having less defects such as pinholes and pores can be formed.

Thus, the water vapor transmittance of the protective film 773 can be lower than or equal to $1\times10^{-5}$ g/(m²·day), preferably lower than or equal to $1\times10^{-6}$ g/(m²·day), further preferably lower than or equal to $1\times10^{-7}$ g/(m²·day), and still further preferably lower than or equal to $1\times10^{-8}$ g/(m²·day).

<<Bonding Layer 705>>

An inorganic material, an organic material, a composite material of an inorganic material and an organic material, or the like can be used for the bonding layer 705.

For example, an organic material such as a resin having thermal fusibility or a curable resin can be used for the bonding layer 705.

For example, an organic material such as a reactive curable adhesive, a light curable adhesive, a thermosetting adhesive, and/or an anaerobic adhesive can be used for the bonding layer 705.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, or the like can be used for the bonding layer 705.

<<Functional Film 710P>>

For example, a circularly polarizing plate, an anti-reflective film, or the like can be used as the functional film 710P.

Alternatively, an antistatic film preventing the attachment of a foreign substance, a water repellent film suppressing the attachment of stain, a hard coat film suppressing a scratch in use, or the like can be used as the functional film 710P.

<<Coloring Film CF>>

The coloring film CF can be formed using a material transmitting light of a predetermined color and can thus be used as a color filter, for example.

For example, the coloring film CF can be formed using a material transmitting light of blue, green, red, yellow, or white.

<<Driver Circuit GD>>

Any of a variety of sequential circuits, such as a shift register, can be used as the driver circuit GD. For example, the transistor MDB or a capacitor can be used in the driver circuit GD. Specifically, a transistor including a semiconductor film that can be formed in the same process as the semiconductor film of the transistor MB can be used.

For example, a transistor having the same structure as the transistor MB can be used as the transistor MD. Alternatively, a transistor having a different structure from the transistor MB can be used as the transistor MDB.

Specifically, a transistor including the conductive film 724 can be used as the transistor MDB (see FIG. 7B).

The semiconductor film 708 is provided between the conductive film 724 and the conductive film 704, and the insulating film 716 is provided between the conductive film 724 and the semiconductor film 708. The insulating film 706 is provided between the semiconductor film 708 and the conductive film 704. For example, the conductive film 724 is electrically connected to a wiring that supplies the same potential as that supplied to the conductive film 704.

<<Driver Circuit SD>>

For example, an integrated circuit can be used in the driver circuit SD. Specifically, an integrated circuit formed over a silicon substrate can be used.

For example, a chip on glass (COG) method can be used to mount the driver circuit SD on a pad which is electrically connected to the pixel circuit 730 (1, j). Specifically, an anisotropic conductive film can be used to mount the integrated circuit on the pad. Note that a structure similar to the structure that can be used for the connection portion 719 can be used for the pad.

<Structure Example 2 of Input/Output Device>

Another structure of an input/output device of one embodiment of the present invention is described with reference to FIGS. 8A and 8B.

FIGS. 8A and 8B illustrate the structure of an input/output device 700C of one embodiment of the present invention. FIG. 8A is a cross-sectional view of the input/output device 700C of one embodiment of the present invention taken along the section lines X1-X2, X3-X4, and X5-X6 in FIG. 6. FIG. 8B is a cross-sectional view showing the details of transistors MC and MDC in FIG. 8A.

Note that the input/output device 700C is different from the input/output device 700B described with reference to FIGS. 7A to 7C in that a conductive film 724C is substituted for the conductive film 724B, a layer 753C containing a light-emitting organic compound is substituted for the layer 753 containing a light-emitting organic compound, and the coloring layer CF is not included. Different structures will be described in detail below, and the above description is referred to for the other similar structures.

The input/output device 700C described in this embodiment includes the conductive film 724C and the layer 753C containing a light-emitting organic compound.

<<Conductive Film 724C>>

For example, the structure that can be used for the first conductive film C1(g), the second conductive film C2(h), or the conductive film 724 described in Embodiment 1 can be used for the conductive film 724C described in this embodiment.

<<Layer 753C Containing Light-Emitting Organic Compound>>

For example, a structure of stacked layers for emitting blue light, green light, or red light can be used for the layer 753C containing a light-emitting organic compound.

<Structure Example 3 of Input/Output Device>

Another structure of an input/output device of one embodiment of the present invention is described with reference to FIGS. 9A and 9B.

FIGS. 9A and 9B illustrate the structure of an input/output device 700E of one embodiment of the present invention. FIG. 9A is a cross-sectional view of the input/output device 700E of one embodiment of the present invention taken along the section lines X1-X2, X3-X4, and X5-X6 in FIG. 6. FIG. 9B is a cross-sectional view showing the details of transistors ME and MDE in FIG. 9A.

Note that the input/output device 700E is different from the input/output device 700C described with reference to FIGS. 8A and 8B in that a top-gate transistor ME or MDE is substituted for the bottom-gate transistor MC or MDC. Different structures will be described in detail below, and the above description is referred to for the other similar structures.

The input/output device 700E described in this embodiment includes the transistor ME or MDE.

<<Transistor ME>>

The transistor ME includes the conductive film 704 having a region overlapping with the insulating film 701C and the semiconductor film 708 having a region provided between the insulating film 701C and the conductive film 704. Note that the conductive film 704 functions as a gate electrode (see FIG. 9B).

The semiconductor film 708 includes a first region 708A, a second region 708B, and a third region 708C. The first region 708A and the second region 708B do not overlap with the conductive film 704. The third region 708C is positioned between the first region 708A and the second region 708B and overlaps with the conductive film 704.

The transistor ME includes the insulating film 706 between the third region 708C and the conductive film 704. Note that the insulating film 706 functions as a gate insulating film.

The first region 708A and the second region 708B have a lower resistance than the third region 708C, and function as a source region and a drain region.

Note that for example, a method for controlling the resistivity of the oxide semiconductor film, which is described in Embodiment 1, can be used to form the first region 708A and the second region 708B in the semiconductor film 708. Specifically, plasma treatment using a gas containing a rare gas can be used. For example, when the conductive film 704 is subjected to plasma treatment using a mask, the shape of part of the third region 708C can be the same as the shape of an end portion of the conductive film 704.

The transistor ME includes the conductive film 712A and the conductive film 712B which are in contact with the first region 708A and the second region 708B, respectively. The conductive film 712A serves as one of the source electrode and the drain electrode, and the conductive film 712B serves as the other of the source electrode and the drain electrode.

The transistor which can be formed in the same process as the transistor ME can be used as the transistor MDE.

This embodiment can be combined with any of the other embodiments in this specification as appropriate.

Embodiment 5

In this embodiment, the input/output device of one embodiment of the present invention or structures of a transistor that can be used in the input/output device of one embodiment of the present invention will be described with reference to FIGS. 10A to 10D.

<Structure Example of Semiconductor Device>

Figure 10A:
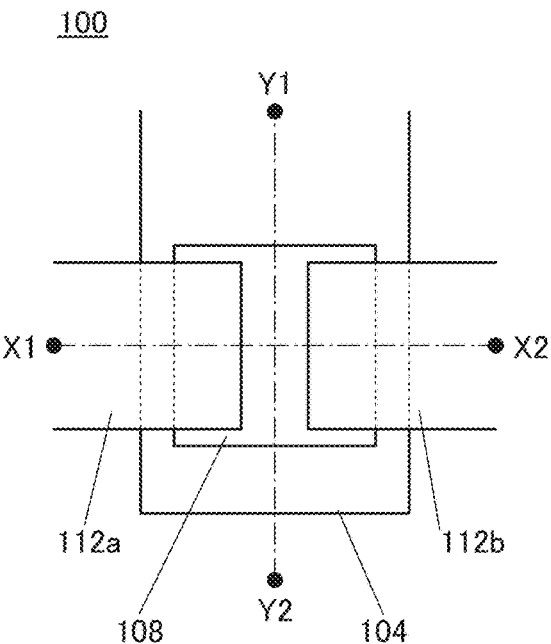
FIGS. 10A to 10D illustrate the structure of a transistor of one embodiment.

FIG. 10A is a top view of a transistor 100. FIG. 10C is a cross-sectional view taken along the section line X1-X2 in FIG. 10A, and FIG. 10D is a cross-sectional view taken along the section line Y1-Y2 in FIG. 10A. Note that in FIG. 10A, some components of the transistor 100 (e.g., an insulating film functioning as a gate insulating film) are not illustrated to avoid complexity. Furthermore, the direction of the section line X1-X2 may be called a channel length direction, and the direction of the section line Y1-Y2 may be called a channel width direction. As in FIG. 10A, some components are not illustrated in some cases in top views of transistors described below.

The transistor 100 can be used for the input/output device 700B described in Embodiment 3.

For example, when the transistor 100 is used as the transistor MB, a substrate 102, a conductive film 104, a stacked film of insulating films 106 and 107, an oxide semiconductor film 108, a conductive film 112a, a conductive film 112b, a stacked film of insulating films 114 and 116, and an insulating film 118 can be referred to as the insulating film 701C, the conductive film 704, the insulating film 706, the semiconductor film 708, the conductive film 712A, the conductive film 712B, the insulating film 716, and the insulating film 718, respectively.

The transistor 100 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, and the conductive film 112a and the conductive film 112b functioning as a source electrode and a drain electrode, respectively, electrically connected to the oxide semiconductor film 108. Over the transistor 100, specifically, over the conductive films 112a and 112b and the oxide semiconductor film 108, insulating films 114, 116, and 118 are provided. The insulating films 114, 116, and 118 function as protective insulating films for the transistor 100.

The oxide semiconductor film 108 includes a first oxide semiconductor film 108a on the conductive film 104 (functioning as a gate electrode) side and a second oxide semiconductor film 108b over the first oxide semiconductor film 108a. The insulating films 106 and 107 function as gate insulating films of the transistor 100.

In-M oxide (M is Ti, Ga, Sn, Y, Zr, La, Ce, Nd, or Hf) or In-M-Zn oxide can be used for the oxide semiconductor film 108. It is particularly preferable to use In-M-Zn oxide for the oxide semiconductor film 108.

The first oxide semiconductor film 108a includes a first region in which the atomic proportion of In is larger than the atomic proportion of M. The second oxide semiconductor film 108b includes a second region in which the atomic proportion of In is smaller than that in the first oxide semiconductor film 108a. The second region includes a portion thinner than the first region.

The first oxide semiconductor film 108a including the first region in which the atomic proportion of In is larger than that of M can increase the field-effect mobility (also simply referred to as mobility or μFE) of the transistor 100. Specifically, the field-effect mobility of the transistor 100 can exceed 10 $cm^2/Vs$.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the first oxide semiconductor film 108a including the first region in which the atomic proportion of In is larger than that of M makes it easier to change electrical characteristics of the transistor 100 in light irradiation. However, in the semiconductor device of one embodiment of the present invention, the second oxide semiconductor film 108b is formed over the first oxide semiconductor film 108a. In addition, the thickness of the channel region in the second oxide semiconductor film 108b is less than the thickness of the first oxide semiconductor film 108a.

Furthermore, the second oxide semiconductor film 108b includes the second region in which the atomic proportion of In is smaller than the first oxide semiconductor film 108a and thus has larger Eg than that of the first oxide semiconductor film 108a. For this reason, the oxide semiconductor film 108 which is a stacked-layer structure of the first oxide semiconductor film 108a and the second oxide semiconductor film 108b has high resistance to a negative bias stress test with light irradiation.

The amount of light absorbed by the oxide semiconductor film 108 with the above structure can be reduced during light irradiation. As a result, the change in electrical characteristics of the transistor 100 due to light irradiation can be reduced. In the semiconductor device of one embodiment of the present invention, the insulating film 114 or the insulating film 116 includes excess oxygen. This structure can further reduce the change in electrical characteristics of the transistor 100 due to light irradiation.

Here, the oxide semiconductor film 108 is described in detail with reference to FIG. 10B.

Figure 10B:
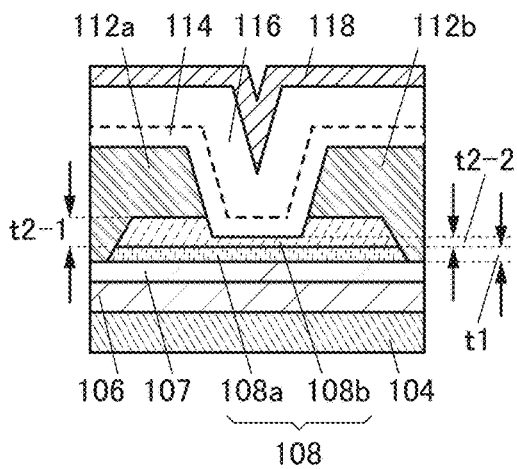
Figure 10C:
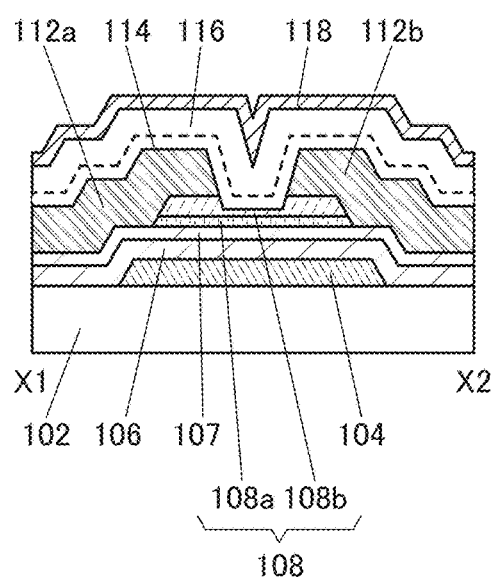
Figure 10D:
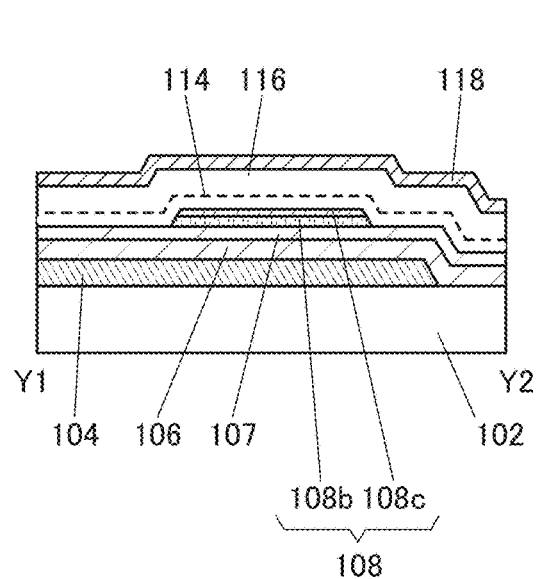

FIG. 10B is a cross-sectional enlarged view of the oxide semiconductor film 108 and the vicinity thereof in the transistor 100 illustrated in FIG. 10C.

In FIG. 10B, t1, t2-1, and t2-2 denote a thickness of the first oxide semiconductor film 108a, one thickness of the second oxide semiconductor film 108b, and the other thickness of the second oxide semiconductor film 108b, respectively. The second oxide semiconductor film 108b over the first oxide semiconductor film 108a prevents the first oxide semiconductor film 108a from being exposed to an etching gas, an etchant, or the like when the conductive films 112a and 112b are formed. This is why the first oxide semiconductor film 108a is not or is hardly reduced in thickness. In contrast, in the second oxide semiconductor film 108b, a portion not overlapping with the conductive films 112a and 112b is etched by formation of the conductive films 112a and 112b, so that a depression is formed in the etched region. In other words, a thickness of the second oxide semiconductor film 108b in a region overlapping with the conductive films 112a and 112b is t2-1, and a thickness of the second oxide semiconductor film 108b in a region not overlapping with the conductive films 112a and 112b is t2-2.

As for the relationships between the thicknesses of the first oxide semiconductor film 108a and the second oxide semiconductor film 108b, t2-1>t1>t2-2 is preferable. A transistor with the thickness relationships can have high field-effect mobility and less variation in threshold voltage in light irradiation.

When oxygen vacancy is formed in the oxide semiconductor film 108 included in the transistor 100, electrons serving as carriers are generated; as a result, the transistor 100 tends to be normally-on. Therefore, for stable transistor characteristics, it is important to reduce oxygen vacancy in the oxide semiconductor film 108 particularly oxygen vacancy in the first oxide semiconductor film 108a. In the structure of the transistor of one embodiment of the present invention, excess oxygen is introduced into an insulating film over the oxide semiconductor film 108, here, the insulating film 114 and/or the insulating film 116 over the oxide semiconductor film 108, whereby oxygen is moved from the insulating film 114 and/or the insulating film 116 to the oxide semiconductor film 108 to fill oxygen vacancy in the oxide semiconductor film 108 particularly in the first oxide semiconductor film 108a.

It is preferable that the insulating films 114 and 116 each include a region (oxygen excess region) including oxygen in excess of that in the stoichiometric composition. In other words, the insulating films 114 and 116 are insulating films capable of releasing oxygen. Note that the oxygen excess region is formed in the insulating films 114 and 116 in such a manner that oxygen is introduced into the insulating films 114 and 116 after the deposition, for example. As a method for introducing oxygen, an ion implantation method, an ion doping method, a plasma immersion ion implantation method, plasma treatment, or the like may be employed.

In order to fill oxygen vacancy in the first oxide semiconductor film 108a, the thickness of the portion including the channel region and the vicinity of the channel region in the second oxide semiconductor film 108b is preferably small, and t2-2<t1 is preferably satisfied. For example, the thickness of the portion including the channel region and the vicinity of the channel region in the second oxide semiconductor film 108b is preferably greater than or equal to 1 nm and less than or equal to 20 nm and further preferably greater than or equal to 3 nm and less than or equal to 10 nm.

Other constituent elements of the semiconductor device of this embodiment are described below in detail.

<<Substrate>>

There is no particular limitation on the property of a material and the like of the substrate 102 as long as the material has heat resistance enough to withstand at least heat treatment to be performed later. For example, a glass substrate, a ceramic substrate, a quartz substrate, or a sapphire substrate may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used as the substrate 102. Alternatively, any of these substrates provided with a semiconductor element may be used as the substrate 102. Note that in the case where a glass substrate is used as the substrate 102, a large substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<<Conductive Film Functioning as Gate Electrode, Source Electrode, and Drain Electrode>>

The conductive film 104 functioning as a gate electrode, and the conductive film 112a and the conductive film 112b functioning as a source electrode and a drain electrode, respectively, each can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these metal elements; or the like.

Furthermore, the conductive films 104, 112a, and 112b may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order can be given. Alternatively, an alloy film or a nitride film in which aluminum and one or more elements selected from titanium, tantalum, tungsten, molybdenum, chromium, neodymium, and scandium are combined may be used.

The conductive films 104, 112a, and 112b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of a Cu—X alloy film enables the manufacturing cost to be reduced because wet etching process can be used in the processing.

<<Insulating Film Functioning as Gate Insulating Film>>

As each of the insulating films 106 and 107 functioning as gate insulating films of the transistor 100, an insulating film including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more such layers may be used.

The insulating film 106 has a function as a blocking film which inhibits penetration of oxygen. For example, in the case where excess oxygen is supplied to the insulating film 107, the insulating film 114, the insulating film 116, and/or the oxide semiconductor film 108, the insulating film 106 can inhibit penetration of oxygen.

Note that the insulating film 107 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 107 is an insulating film capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used for the insulating film 107, the following effect is attained. Hafnium oxide has a higher dielectric constant than silicon oxide and silicon oxynitride. Therefore, hafnium oxide, can reduce the leakage current due to tunnel current because the use of hafnium oxide can increase the thickness of the insulating film 107 as compared with the use of silicon oxide. That is, it is possible to provide a transistor with a low off-state current. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a greater thickness for capacitance equivalent to that of the silicon oxide film. Thus, when the silicon nitride film is included in the gate insulating film of the transistor 100, the physical thickness of the insulating film can be increased. This makes it possible to reduce a decrease in withstand voltage of the transistor 100 and furthermore to increase the withstand voltage, thereby reducing electrostatic discharge damage to the transistor 100.

<<Oxide Semiconductor Film>>

The oxide semiconductor film 108 can be formed using the materials described above.

In the case where the oxide semiconductor film 108 includes In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable.

In the case where the oxide semiconductor film 108 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 108 having crystallinity. Note that the atomic ratios of metal elements in the formed oxide semiconductor film 108 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor film 108 may be 4:2:3 or in the vicinity of 4:2:3.

The first oxide semiconductor film 108a can be formed using the sputtering target having an atomic ratio of In:M:Zn=2:1:3, In:M:Zn=3:1:2, or In:M:Zn=4:2:4.1, for example. The second oxide semiconductor film 108b can be formed using the sputtering target having an atomic ratio of In:M:Zn=1:1:1 or In:M:Zn=1:1:1.2, for example. Note that the atomic ratio of metal elements in a sputtering target used for forming the second oxide semiconductor film 108b does not necessarily satisfy In≥M and Zn≥M, and may satisfy In≥M and Zn<M, such as In:M:Zn=1:3:2.

The energy gap of the oxide semiconductor film 108 is 2 eV or more, preferably 2.5 eV or more, and further preferably 3 eV or more. The use of an oxide semiconductor having a wide energy gap can reduce off-state current of the transistor 100. In particular, an oxide semiconductor film having an energy gap of 2 eV or more, preferably 2 eV or more, and 3.0 eV or less is preferably used as the first oxide semiconductor film 108a, and an oxide semiconductor film having an energy gap of 2.5 eV or more and 3.5 eV or less is preferably used as the second oxide semiconductor film 108b. Furthermore, the second oxide semiconductor film 108b preferably has a higher energy gap than that of the first oxide semiconductor film 108a.

Each thickness of the first oxide semiconductor film 108a and the second oxide semiconductor film 108b is larger than or equal to 3 nm and smaller than or equal to 200 nm, preferably larger than or equal to 3 nm and smaller than or equal to 100 nm and further preferably larger than or equal to 3 nm and smaller than or equal to 50 nm. Note that the above-described thickness relationships between them are preferably satisfied.

An oxide semiconductor film with low carrier density is used as the second oxide semiconductor film 108b. For example, the carrier density of the second oxide semiconductor film 108b is lower than or equal to $1 \times 10^{17}/\text{cm}^3$, preferably lower than or equal to $1 \times 10^{15}/\text{cm}^3$, further preferably lower than or equal to $1 \times 10^{13}/\text{cm}^3$, and still further preferably lower than or equal to $1 \times 10^{11}/\text{cm}^3$.

Note that without limitation to the compositions and materials described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the first oxide semiconductor film 108a and the second oxide semiconductor film 108b be set to be appropriate.

Note that it is preferable to use, as the first oxide semiconductor film 108a and the second oxide semiconductor film 108b, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1 \times 10^6$ μm and a channel length of 10 μm, the off-state current can be less than or equal to the measurement limit of a semiconductor parameter analyzer, that is, less than or equal to $1 \times 10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, further preferably lower than or equal to $5 \times 10^{18}$ atoms/cm$^3$, further preferably lower than or equal to $1 \times 10^{18}$ atoms/cm$^3$, further preferably lower than or equal to $5 \times 10^{17}$ atoms/cm$^3$, and still further preferably lower than or equal to $1 \times 10^{16}$ atoms/cm$^3$.

The first oxide semiconductor film 108a preferably includes a region having a lower hydrogen concentration than the second oxide semiconductor film 108b. When the first oxide semiconductor film 108a includes the region having a lower hydrogen concentration than the second oxide semiconductor film 108b, the semiconductor device can be highly reliable.

When silicon or carbon that is one of elements belonging to Group 14 is included in the first oxide semiconductor film 108a, oxygen vacancy is increased in the first oxide semiconductor film 108a, and the first oxide semiconductor film 108a becomes an n-type film. Thus, the concentration of silicon or carbon (the concentration is measured by SIMS) in the first oxide semiconductor film 108a or the concentration of silicon or carbon (the concentration is measured by SIMS) in the vicinity of an interface with the first oxide semiconductor film 108a is set to be lower than or equal to $2 \times 10^{18}$ atoms/cm$^3$, preferably lower than or equal to $2 \times 10^{17}$ atoms/cm$^3$.

In addition, the concentration of alkali metal or alkaline earth metal of the first oxide semiconductor film 108a, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the first oxide semiconductor film 108a.

Furthermore, when including nitrogen, the first oxide semiconductor film 108a easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm$^3$.

Each of the first oxide semiconductor film 108a and the second oxide semiconductor film 108b may have a non-single-crystal structure, for example. The non-single crystal structure includes a c-axis aligned crystalline oxide semiconductor (CAAC-OS) described later, a polycrystalline structure, a microcrystalline structure, or an amorphous structure, for example. Among the non-single crystal structure, the amorphous structure has the highest density of defect states, whereas CAAC-OS has the lowest density of defect states.

<<Insulating Film Functioning as Protective Insulating Film of Transistor>>

The insulating films 114 and 116 each have a function of supplying oxygen to the oxide semiconductor film 108. The insulating film 118 has a function of a protective insulating film of the transistor 100. The insulating films 114 and 116 include oxygen. Furthermore, the insulating film 114 is an insulating film capable of transmitting oxygen. The insulating film 114 also functions as a film which relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm, can be used as the insulating film 114.

In addition, it is preferable that the number of defects in the insulating film 114 be small and typically, the spin density corresponding to a signal that appears at g=2.001 due to a dangling bond of silicon be lower than or equal to $3\times10^{17}$ spins/cm$^3$ by electron spin resonance (ESR) measurement. This is because if the density of defects in the insulating film 114 is high, oxygen is bonded to the defects and the amount of oxygen that transmits the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film capable of transmitting oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the amount of released ammonia is larger than the amount of released nitrogen oxide in TDS analysis; the amount of released ammonia is typically greater than or equal to $1\times10^{18}$/cm$^3$ and less than or equal to $5\times10^{19}$/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6\times10^{20}$ atoms/cm$^3$.

The above oxide insulating film is formed by a PECVD method at a film surface temperature higher than or equal to 220° C. and lower than or equal to 350° C. using silane and dinitrogen monoxide, whereby a dense and hard film can be formed.

The insulating film 116 is formed using an oxide insulating film that contains oxygen in excess of that in the stoichiometric composition. Part of oxygen is released by heating from the oxide insulating film including oxygen in excess of that in the stoichiometric composition. The oxide insulating film including oxygen in excess of that in the stoichiometric composition is an oxide insulating film of which the amount of released oxygen converted into oxygen atoms is greater than or equal to $1.0\times10^{19}$ atoms/cm$^3$, preferably greater than or equal to $3.0\times10^{20}$ atoms/cm$^3$, in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm, can be used as the insulating film 116.

It is preferable that the number of defects in the insulating film 116 be small, and typically the spin density corresponding to a signal which appears at g=2.001 due to a dangling bond of silicon be lower than $1.5\times10^{18}$ spins/cm$^3$, preferably lower than or equal to $1\times10^{18}$ spins/cm$^3$, by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114 may be employed.

The insulating film 118 includes nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Although the variety of films such as the conductive films, the insulating films, and the oxide semiconductor films which are described above can be formed by a sputtering method or a PECVD method, such films may be formed by another method, e.g., a thermal CVD method. Examples of the thermal CVD method include a metal organic chemical vapor deposition (MOCVD) method and an atomic layer deposition (ALD) method.

A thermal CVD method has an advantage that no defect due to plasma damage is generated because it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed with a deposition apparatus using an ALD method, a $WF_6$ gas and a $B_2H_6$ gas are sequentially introduced plural times to form an initial tungsten film, and then a $WF_6$ gas and an $H_2$ gas are used, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus using an ALD method, an $In(CH_3)_3$ gas and an $O_3$ gas are sequentially introduced plural times to form an InO layer, a GaO layer is formed using a $Ga(CH_3)_3$ gas and an $O_3$ gas, and then a ZnO layer is formed using a $Zn(CH_3)_2$ gas and an $O_3$ gas. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling water with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined with any of the other embodiments in this specification as appropriate.

Embodiment 6

In this embodiment, the input/output device of one embodiment of the present invention or structures of a transistor that can be used in the input/output device of one embodiment of the present invention will be described with reference to FIGS. 11A to 11C.

<Structure Example of Semiconductor Device>

Figure 11A:
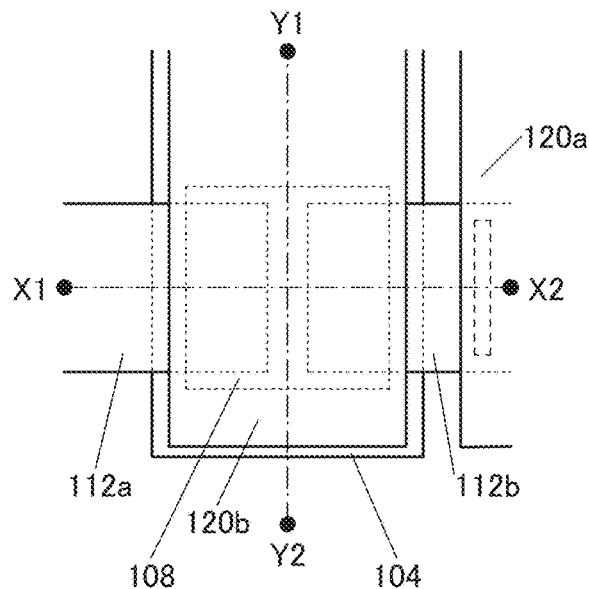
FIGS. 11A to 11C illustrate the structure of a transistor of one embodiment.
Figure 11B:
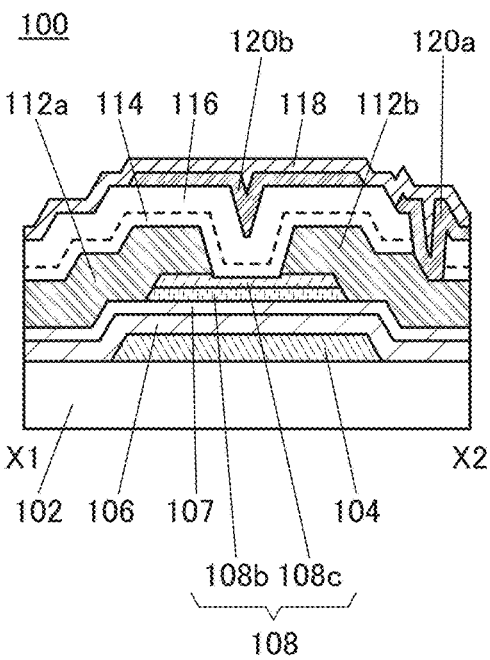
Figure 11C:
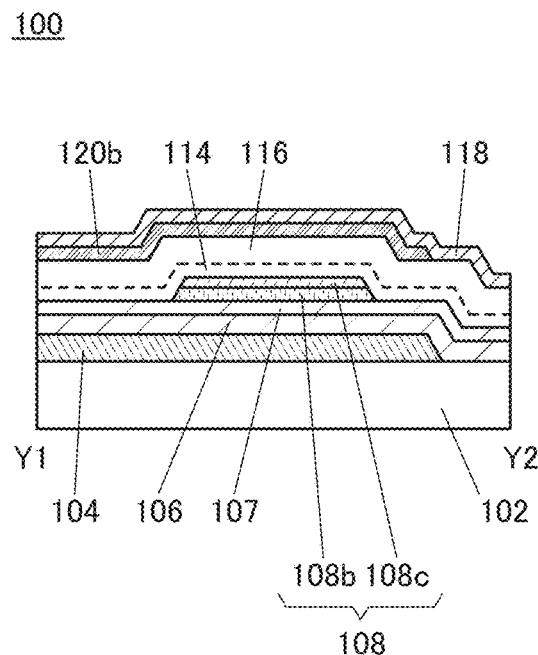

FIG. 11A is a top view of the transistor 100. FIG. 11B is a cross-sectional view taken along the section line X1-X2 in FIG. 11A, and FIG. 11C is a cross-sectional view taken along the section line Y1-Y2 in FIG. 11A. Note that in FIG. 11A, some components of the transistor 100 (e.g., an insulating film functioning as a gate insulating film) are not illustrated to avoid complexity. Furthermore, the direction of the section line X1-X2 may be called a channel length direction, and the direction of the section line Y1-Y2 may be called a channel width direction. As in FIG. 11A, some components are not illustrated in some cases in top views of transistors described below.

The transistor 100 can be used for the input/output device 700B described in Embodiment 3.

For example, when the transistor 100 is used as the transistor MB, the substrate 102, the conductive film 104, a stacked film of the insulating films 106 and 107, the oxide semiconductor film 108, the conductive film 112a, the conductive film 112b, a stacked film of the insulating films 114 and 116, the insulating film 118, and a conductive film 120b can be referred to as the insulating film 701C, the conductive film 704, the insulating film 706, the semiconductor film 708, the conductive film 712A, the conductive film 712B, the insulating film 716, the insulating film 718, and the conductive film 724B, respectively.

The transistor 100 includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the conductive films 112a and 112b functioning as a source electrode and a drain electrode, respectively, electrically connected to the oxide semiconductor film 108, the insulating films 114 and 116 over the oxide semiconductor film 108 and the conductive films 112a and 112b, a conductive film 120a that is over the insulating film 116 and electrically connected to the conductive film 112b, the conductive film 120b over the insulating film 116, and the insulating film 118 over the insulating film 116 and the conductive films 120a and 120b.

The insulating films 106 and 107 function as a first gate insulating film of the transistor 100. The insulating films 114 and 116 function as a second gate insulating film of the transistor 100. The insulating film 118 functions as a protective insulating film of the transistor 100. In this specification and the like, the insulating films 106 and 107 are collectively referred to as a first insulating film, the insulating films 114 and 116 are collectively referred to as a second insulating film, and the insulating film 118 is referred to as a third insulating film in some cases.

The conductive film 120b can be used as a second gate electrode of the transistor 100.

In the case where the transistor 100 is used in a pixel portion of a display panel, the conductive film 120a can be used as an electrode of a display element, or the like.

The oxide semiconductor film 108 includes the oxide semiconductor film 108b on the conductive film 104 (functioning as a first gate electrode) side, and an oxide semiconductor film 108c over the oxide semiconductor film 108b. The oxide semiconductor film 108b and the oxide semiconductor film 108c contain In, M (M is Al, Ga, Y, or Sn), and Zn.

The oxide semiconductor film 108b preferably includes a region in which the atomic proportion of In is larger than the atomic proportion of M, for example. The oxide semiconductor film 108c preferably includes a region in which the atomic proportion of In is smaller than that in the oxide semiconductor film 108b.

The oxide semiconductor film 108b including the region in which the atomic proportion of In is larger than that of M can increase the field-effect mobility (also simply referred to as mobility or μFE) of the transistor 100. Specifically, the field-effect mobility of the transistor 100 can exceed 10 $cm^2/Vs$, preferably exceed 30 $cm^2/Vs$.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the oxide semiconductor film 108b including the region in which the atomic proportion of In is larger than that of M makes it easier to change electrical characteristics of the transistor 100 in light irradiation. However, in the semiconductor device of one embodiment of the present invention, the oxide semiconductor film 108c is formed over the oxide semiconductor film 108b. Furthermore, the oxide semiconductor film 108c including the region in which the atomic proportion of In is smaller than that in the oxide semiconductor film 108b has larger Eg than the oxide semiconductor film 108b. For this reason, the oxide semiconductor film 108 which has a stacked-layer structure of the oxide semiconductor film 108b and the oxide semiconductor film 108c has high resistance to a negative bias stress test with light irradiation.

Impurities such as hydrogen or moisture entering the channel region of the oxide semiconductor film 108, particularly the oxide semiconductor film 108b adversely affect the transistor characteristics and therefore cause a problem. Moreover, it is preferable that the amount of impurities such as hydrogen or moisture in the channel region of the oxide semiconductor film 108b be as small as possible. Furthermore, oxygen vacancies formed in the channel region in the oxide semiconductor film 108b adversely affect the transistor characteristics and therefore cause a problem. For example, oxygen vacancies formed in the channel region in the oxide semiconductor film 108b are bonded to hydrogen to serve as a carrier supply source. The carrier supply source generated in the channel region in the oxide semiconductor film 108b causes a change in the electrical characteristics, typically, a shift in the threshold voltage, of the transistor 100 including the oxide semiconductor film 108b. Therefore, it is preferable that the amount of oxygen vacancies in the channel region of the oxide semiconductor film 108b be as small as possible.

In view of this, one embodiment of the present invention is a structure in which insulating films in contact with the oxide semiconductor film 108, specifically the insulating film 107 formed under the oxide semiconductor film 108 and the insulating films 114 and 116 formed over the oxide semiconductor film 108 include excess oxygen. Oxygen or excess oxygen is transferred from the insulating film 107 and the insulating films 114 and 116 to the oxide semiconductor film 108, whereby the oxygen vacancies in the oxide semiconductor film can be reduced. As a result, a change in electrical characteristics of the transistor 100, particularly a change in the transistor 100 due to light irradiation, can be reduced.

In one embodiment of the present invention, a manufacturing method is used in which the number of manufacturing steps is not increased or an increase in the number of manufacturing steps is extremely small, because the insulating film 107 and the insulating films 114 and 116 are made to contain excess oxygen. Thus, the transistors 100 can be manufactured with high yield.

Specifically, in a step of forming the oxide semiconductor film 108b, the oxide semiconductor film 108b is formed by a sputtering method in an atmosphere containing an oxygen gas, whereby oxygen or excess oxygen is added to the insulating film 107 over which the oxide semiconductor film 108b is formed.

Furthermore, in a step of forming the conductive films 120a and 120b, the conductive films 120a and 120b are formed by a sputtering method in an atmosphere containing an oxygen gas, whereby oxygen or excess oxygen is added to the insulating film 116 over which the conductive films 120a and 120b are formed. Note that in some cases, oxygen or excess oxygen is added also to the insulating film 114 and the oxide semiconductor film 108 under the insulating film 116 when oxygen or excess oxygen is added to the insulating film 116.

<Oxide Conductor>

Next, an oxide conductor is described. In a step of forming the conductive films 120a and 120b, the conductive films 120a and 120b serve as a protective film for suppressing release of oxygen from the insulating films 114 and 116. The conductive films 120a and 120b serve as semiconductors before a step of forming the insulating film 118 and serve as conductors after the step of forming the insulating film 118.

To allow the conductive films 120a and 120b to serve as conductors, an oxygen vacancy is formed in the conductive films 120a and 120b and hydrogen is added from the insulating film 118 to the oxygen vacancy, whereby a donor level is formed in the vicinity of the conduction band. As a result, the conductivity of each of the conductive films 120a and 120b is increased, so that the conductive films 120a and 120b become conductors. The conductive films 120a and 120b having become conductors each can be referred to as oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small in an oxide conductor, and an oxide conductor has a visible light transmitting property comparable to that of an oxide semiconductor.

<Components of Semiconductor Device>

Components of the semiconductor device of this embodiment are described below in detail.

As materials described below, materials similar to the materials described in Embodiment 5 can be used.

The material that can be used for the substrate 102 described in Embodiment 5 can be used for the substrate 102 described in this embodiment. Furthermore, the materials that can be used for the insulating films 106 and 107 described in Embodiment 5 can be used for the insulating films 106 and 107 described in this embodiment.

In addition, the materials that can be used for the conductive films functioning as the gate electrode, the source electrode, and the drain electrode described in Embodiment 5 can be used for the conductive films functioning as the first gate electrode, the source electrode, and the drain electrode described in this embodiment.

<<Oxide Semiconductor Film>>

The oxide semiconductor film 108 can be formed using the materials described above.

In the case where the oxide semiconductor film 108b includes In-M-Zn oxide, it is preferable that the atomic ratio of metal elements of a sputtering target used for forming the In-M-Zn oxide satisfy In>M. The atomic ratio between metal elements in such a sputtering target is, for example, In:M:Zn=2:1:3, In:M:Zn=3:1:2, or In:M:Zn=4:2:4.1.

In the case where the oxide semiconductor film 108c is In-M-Zn oxide, it is preferable that the atomic ratio of metal elements of a sputtering target used for forming a film of the In-M-Zn oxide satisfy In≤M. The atomic ratio of metal elements in such a sputtering target is, for example, In:M:Zn=1:1:1, In:M:Zn=1:1:1.2, In:M:Zn=1:3:2, In:M:Zn=1:3:4, or In:M:Zn=1:3:6.

In the case where the oxide semiconductor film 108b and the oxide semiconductor film 108c are formed of In-M-Zn oxide, it is preferable to use a target including polycrystalline In-M-Zn oxide as the sputtering target. The use of the target including polycrystalline In-M-Zn oxide facilitates formation of the oxide semiconductor film 108b and the oxide semiconductor film 108c having crystallinity. Note that the atomic ratios of metal elements in each of the formed oxide semiconductor film 108b and the formed oxide semiconductor film 108c vary from the above atomic ratio of metal elements of the sputtering target within a range of ±40% as an error. For example, when a sputtering target of the oxide semiconductor film 108b with an atomic ratio of In to Ga and Zn of 4:2:4.1 is used, the atomic ratio of In to Ga and Zn in the oxide semiconductor film 108b may be 4:2:3 or in the vicinity of 4:2:3.

The energy gap of the oxide semiconductor film 108 is 2 eV or more, preferably 2.5 eV or more, and further preferably 3 eV or more. The use of an oxide semiconductor having a wide energy gap can reduce off-state current of the transistor 100. In particular, an oxide semiconductor film having an energy gap of 2 eV or more, preferably 2 eV or more and 3.0 eV or less, is preferably used as the oxide semiconductor film 108b, and an oxide semiconductor film having an energy gap of 2.5 eV or more and 3.5 eV or less is preferably used as the oxide semiconductor film 108c. Furthermore, the oxide semiconductor film 108c preferably has a higher energy gap than the oxide semiconductor film 108b.

Each thickness of the oxide semiconductor film 108b and the oxide semiconductor film 108c is greater than or equal to 3 nm and less than or equal to 200 nm, preferably greater than or equal to 3 nm and less than or equal to 100 nm and further preferably greater than or equal to 3 nm and less than or equal to 50 nm.

An oxide semiconductor film with a low carrier density is used as the oxide semiconductor film 108c. For example, the carrier density of the oxide semiconductor film 108c is lower than or equal to $1\times10^{17}$/cm$^3$, preferably lower than or equal to $1\times10^{15}$/cm$^3$, further preferably lower than or equal to $1\times10^{13}$/cm$^3$, and still further preferably lower than or equal to $1\times10^{11}$/cm$^3$.

Note that without limitation to the compositions and materials described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108b and the oxide semiconductor film 108c be set to be appropriate.

Note that it is preferable to use, as the oxide semiconductor film 108b and the oxide semiconductor film 108c, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1\times10^6$ μm and a channel length L of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, and alkaline earth metal are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and still further preferably lower than or equal to $1\times10^{16}$ atoms/cm$^3$.

The oxide semiconductor film 108b preferably includes a region in which hydrogen concentration is smaller than that in the oxide semiconductor film 108c. A semiconductor device including the oxide semiconductor film 108b having the region in which hydrogen concentration is smaller than that in the oxide semiconductor film 108c can be increased in reliability.

When silicon or carbon that is one of elements belonging to Group 14 is included in the oxide semiconductor film 108b, oxygen vacancy increases in the oxide semiconductor film 108b, and the oxide semiconductor film 108b becomes an n-type film. Thus, the concentration of silicon or carbon (the concentration is measured by SIMS) in the oxide semiconductor film 108b or the concentration of silicon or carbon (the concentration is measured by SIMS) in the vicinity of an interface with the oxide semiconductor film 108b is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the oxide semiconductor film 108b, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108b.

Furthermore, when including nitrogen, the oxide semiconductor film 108b easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$.

The oxide semiconductor film 108b and the oxide semiconductor film 108c may have a non-single-crystal structure, for example. The non-single crystal structure includes a c-axis aligned crystalline oxide semiconductor (CAAC-OS) described later, a polycrystalline structure, a microcrystalline structure, or an amorphous structure, for example. Among the non-single crystal structure, the amorphous structure has the highest density of defect states, whereas CAAC-OS has the lowest density of defect states.

<<Insulating Films Functioning as Second Gate Insulating Film>>

The insulating films 114 and 116 function as a second gate insulating film of the transistor 100. In addition, the insulating films 114 and 116 each have a function of supplying oxygen to the oxide semiconductor film 108. That is, the insulating films 114 and 116 contain oxygen. Furthermore, the insulating film 114 is an insulating film which can transmit oxygen. Note that the insulating film 114 also functions as a film which relieves damage to the oxide semiconductor film 108 at the time of forming the insulating film 116 in a later step.

For example, the insulating films 114 and 116 described in Embodiment 5 can be used as the insulating films 114 and 116 described in this embodiment.

<<Oxide Semiconductor Film Functioning as Conductive Film and Oxide Semiconductor Film Functioning as Second Gate Electrode>>

A material similar to the material of the oxide semiconductor film 108 described above can be used for the conductive film 120a functioning as a conductive film and the conductive film 120b functioning as the second gate electrode.

That is, the conductive film 120a functioning as a conductive film and the conductive film 120b functioning as a second gate electrode contain a metal element which is the same as that contained in the oxide semiconductor film 108 (the oxide semiconductor film 108b and the oxide semiconductor film 108c). For example, the conductive film 120b functioning as a second gate electrode and the oxide semiconductor film 108 (the oxide semiconductor film 108b and the oxide semiconductor film 108c) contain the same metal element; thus, the manufacturing cost can be reduced.

For example, in the case where the conductive film 120a functioning as a conductive film and the conductive film 120b functioning as a second gate electrode are each In-M-Zn oxide, the atomic ratio of metal elements in a sputtering target used for forming the In-M-Zn oxide preferably satisfies In≥M. The atomic ratio of metal elements in such a sputtering target is In:M:Zn=2:1:3, In:M:Zn=3:1:2, In:M:Zn=4:2:4.1, or the like.

The conductive film 120a functioning as a conductive film and the conductive film 120b functioning as a second gate electrode can each have a single-layer structure or a stacked-layer structure of two or more layers. Note that in the case where the conductive films 120a and 120b each have a stacked-layer structure, the composition of the sputtering target is not limited to that described above.

<<Insulating Film Functioning as Protective Insulating Film of Transistor>>

The insulating film 118 functions as a protective insulating film of the transistor 100.

The insulating film 118 includes one or both of hydrogen and nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118.

The insulating film 118 has a function of supplying one or both of hydrogen and nitrogen to the conductive film 120a functioning as a conductive film and the conductive film 120b functioning as a second gate electrode. The insulating film 118 preferably includes hydrogen and has a function of supplying the hydrogen to the conductive films 120a and 120b. The conductive films 120a and 120b supplied with hydrogen from the insulating film 118 function as conductors.

A nitride insulating film, for example, can be used as the insulating film 118. The nitride insulating film is formed using silicon nitride, silicon nitride oxide, aluminum nitride, aluminum nitride oxide, or the like.

Although the variety of films such as the conductive films, the insulating films, and the oxide semiconductor films which are described above can be formed by a sputtering method or a PECVD method, such films may be formed by another method, e.g., a thermal CVD method. Examples of the thermal CVD method include an MOCVD method and an ALD method.

A thermal CVD method has an advantage that no defect due to plasma damage is generated because it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed with a deposition apparatus using an ALD method, a $WF_6$ gas and a $B_2H_6$ gas are sequentially introduced plural times to form an initial tungsten film, and then a $WF_6$ gas and an $H_2$ gas are used, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus using an ALD method, an $In(CH_3)_3$ gas and an $O_3$ gas are sequentially introduced plural times to form an InO layer, a GaO layer is formed using a $Ga(CH_3)_3$ gas and an $O_3$ gas, and then a ZnO layer is formed using a $Zn(CH_3)_2$ gas and an $O_3$ gas. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling water with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined with any of the other embodiments in this specification as appropriate.

Embodiment 7

In this embodiment, the structure of a data processor of one embodiment of the present invention will be described with reference to FIGS. 12A and 12B and FIGS. 13A and 13B.

Figure 12A:
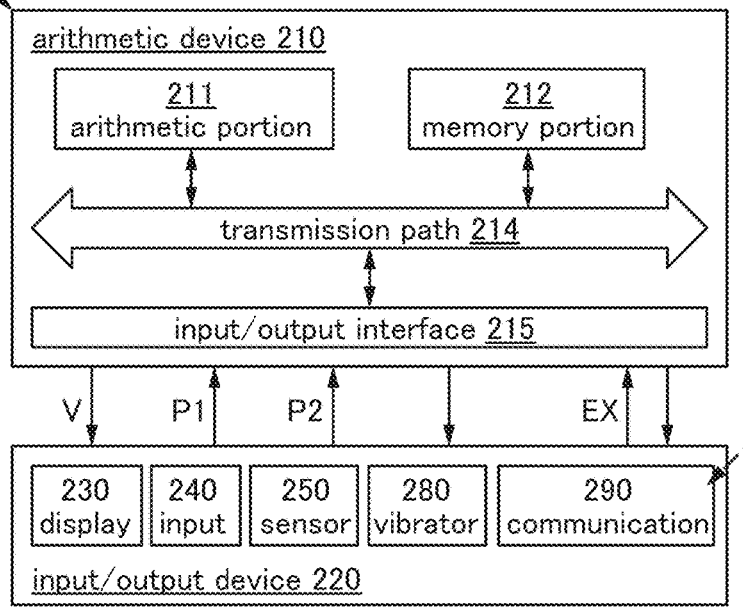
FIG. 12A is a block diagram and FIG. 12B is a projection view each illustrating the structure of a data processor of one embodiment.
Figure 12B:
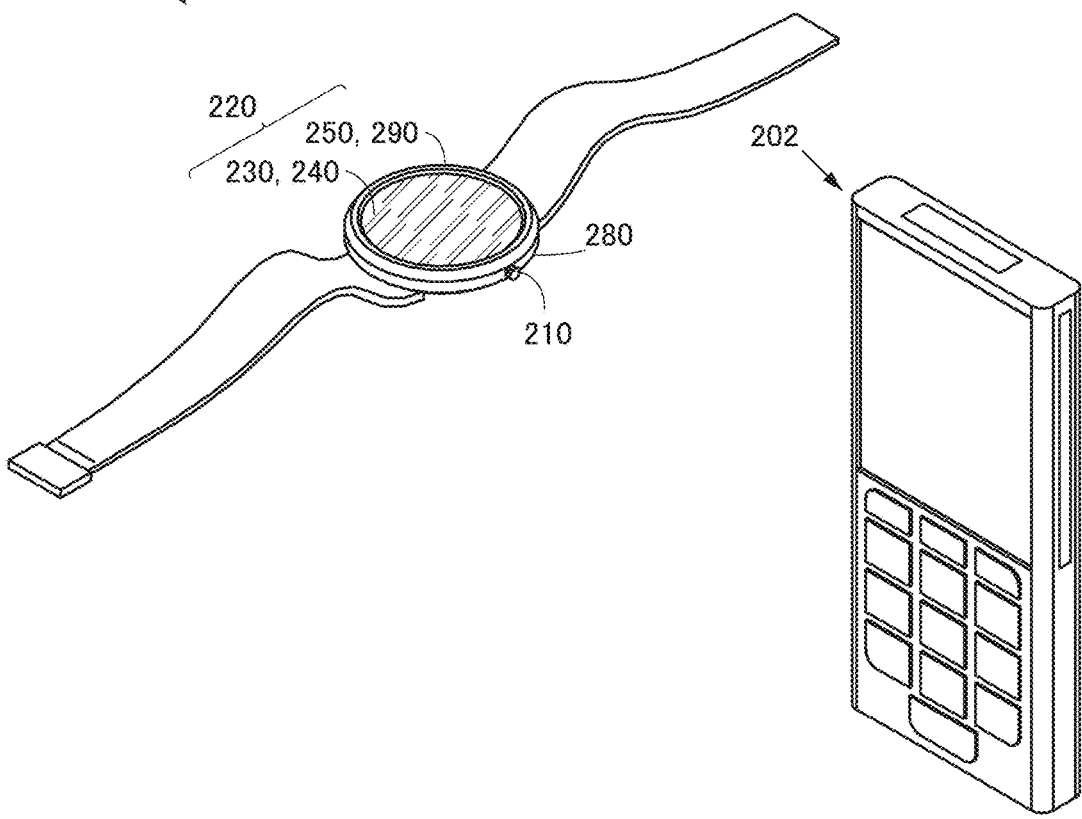

FIG. 12A is a block diagram illustrating the structure of a data processor 200. FIG. 12B is a projection view illustrating an example of an external view of the data processor 200 and a communication device 202 which can be used with the data processor 200.

Figure 13A:
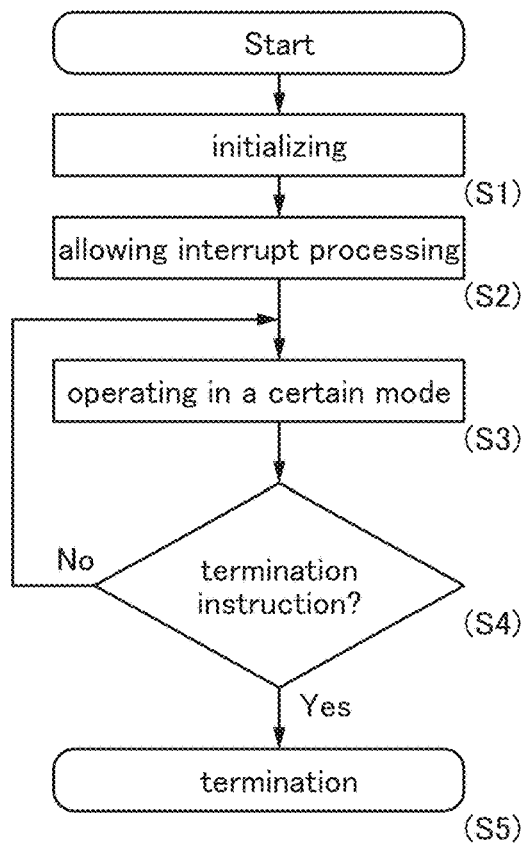
FIGS. 13A and 13B are flow charts showing a program of one embodiment.
Figure 13B:
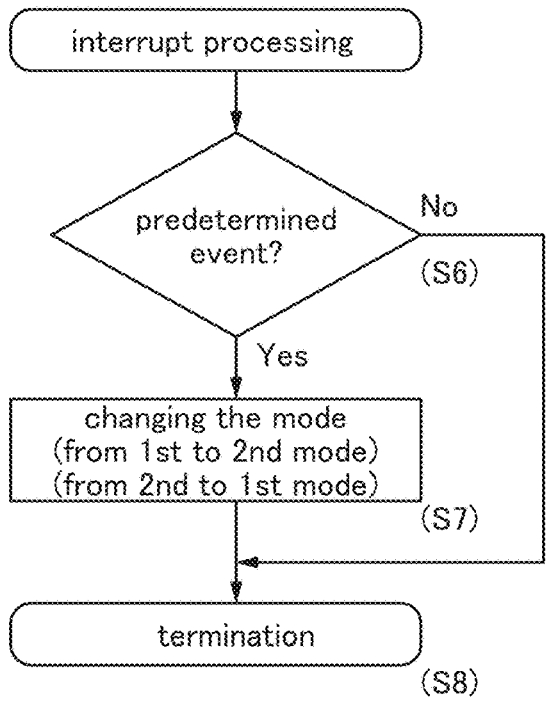

FIG. 13A is a flow chart showing main processing of a program of one embodiment of the present invention, and FIG. 13B is a flow chart showing interruption processing.

<Structure Example of Data Processor>

The data processor 200 described in this embodiment includes an arithmetic device 210 and an input/output device 220 (see FIG. 12A).

The arithmetic device 210 has a function of receiving positional data P1 and external data EX and supplying image data V and control data. In this specification, text data is included in the image data V.

The input/output device 220 has a function of supplying the positional data P1 and the external data EX and receiving the image data V and the control data.

The arithmetic device 210 has a function of generating the image data V on the basis of the external data EX and determining and supplying the control data on the basis of the positional data P1.

The input/output device 220 includes a display portion 230 having a function of displaying the image data V, an input portion 240 having a function of supplying the positional data P1, and a communication portion 290 having a function of receiving the external data EX, supplying the external data EX, and sending the control data.

For example, the input/output panel described in Embodiment 1 can be used for the display portion 230 and the input portion 240 described in this embodiment.

Owing to the structure, for example, image data is generated on the basis of external data received from an external device and can be displayed on the display portion. Control data is determined on the basis of positional data supplied using the input portion and can be sent. Thus, a novel data processor that is highly convenient or reliable can be provided.

<Configuration>

The data processor of one embodiment of the present invention includes the arithmetic device 210, the input/output device 220, and a housing (see FIG. 12A).

<<Arithmetic Device 210>>

The arithmetic device 210 includes an arithmetic portion 211, a memory portion 212, a transmission path 214, or an input/output interface 215.

<<Input/Output Device 220>>

The input/output device 220 includes the display portion 230, the input portion 240, a sensor portion 250, a vibrator 280, or the communication portion 290.

<<Arithmetic Portion 211>>

The arithmetic portion 211 has a function of, for example, executing a program. For example, a CPU described in Embodiment 7 can be used for the arithmetic portion 211. In that case, power consumption can be sufficiently reduced.

<<Memory Portion 212>>

The memory portion 212 has a function of, for example, storing the program executed by the arithmetic portion 211, initial data, setting data, an image, or the like.

Specifically, a hard disk, a flash memory, a memory including a transistor including an oxide semiconductor, or the like can be used for the memory portion 212.

<<Input/Output Interface 215 and Transmission Path 214>>

The input/output interface 215 includes a terminal or a wiring and has a function of supplying and receiving data. For example, the input/output interface 215 can be electrically connected to the transmission path 214 and the input/output device 220.

The transmission path 214 includes a wiring and has a function of supplying and receiving data. For example, the transmission path 214 can be electrically connected to the input/output interface 215. In addition, the transmission path 214 can be electrically connected to the arithmetic portion 211, the memory portion 212, or the input/output interface 215.

<<Display Portion 230 and Input Portion 240>>

For example, an input/output panel including the display portion 230 and the input portion 240 can be used. Specifically, the input/output panel described in Embodiment 1 can be used.

A variety of human interfaces or the like can be used as the input portion 240 (see FIG. 12A).

For example, a keyboard, a mouse, a touch sensor, a microphone, a camera, or the like can be used as the input portion 240. Note that a touch sensor having a region overlapping with the display portion 230 can also be used. An input/output panel that includes the display portion 230 and the touch sensor having a region overlapping with the display portion 230 can be referred to as a touch panel.

For example, a user can make various gestures (e.g., tap, drag, swipe, and pinch in) using his/her finger as a pointer on the touch panel.

The arithmetic device 210, for example, analyzes data on the position, track, or the like of the finger on the touch panel and determines that a specific gesture is supplied when the analysis results meet predetermined conditions. Therefore, the user can supply a certain operation instruction associated with a certain gesture by using the gesture.

For instance, the user can supply a "scrolling instruction" for changing a portion where image data is displayed by using a gesture of touching and moving his/her finger on the touch panel.

<<Sensor Portion 250>>

The sensor portion 250 has a function of supplying data P2 by detecting the surrounding state.

For example, a camera, an acceleration sensor, a direction sensor, a pressure sensor, a temperature sensor, a humidity sensor, an illuminance sensor, or a global positioning system (GPS) signal receiving circuit can be used as the sensor portion 250.

<<Vibrator 280>>

The vibrator 280 includes, for example, a vibration generating device, and has a function of vibrating on the basis of the instruction from the arithmetic device 210. Thus, the user of the data processor 200 can receive data with the vibration.

<<Communication Portion 290>>

The communication portion 290 has a function of supplying and obtaining data to/from a network or the like. Alternatively, the communication portion 290 has a function of supplying and obtaining data to/from another communication device or the like.

<<Housing>>

The data processor 200 includes a housing that stores the arithmetic device 210 and the input/output device 220.

Accordingly, the user of the data processor 200 can check image data transmitted from the communication device 202 without taking the communication device or the like out.

<Communication Device 202>

The communication device 202 has a function of sending the external data EX, receiving the control data, and being connected to a communication network. The communication device 202 also has a function of conducting a certain operation on the basis of the control data.

For example, data communication can be performed between the communication device 202 and the communication network. Specifically, communication of data including audio data and the like is possible.

For example, the communication device 202 can be operated with the data processor 200. Furthermore, the data processor 200 can be operated with the communication device 202.

<Program>

A program which can be used for one embodiment of the present invention is described with reference to FIGS. 13A and 13B.

The program of one embodiment of the present invention includes the following steps (see FIG. 13A).

<<First Step>>

In a first step, setting is initialized (see S1 in FIG. 13A).

For instance, predetermined image data and a first mode can be used for the initialization.

<<Second Step>>

In a second step, interrupt processing is allowed (see S2 in FIG. 13A). Note that an arithmetic device allowed to execute the interrupt processing can perform the interrupt processing in parallel with the main processing. The arithmetic device which has returned from the interrupt processing to the main processing can reflect the results of the interrupt processing in the main processing.

The arithmetic device may execute the interrupt processing when a counter has an initial value, the counter may be set at a value other than the initial value, and then the arithmetic device may return to the main processing. Thus, the interrupt processing is ready to be executed after the program is started up.

<<Third Step>>

In a third step, the arithmetic device is operated in a certain mode set in the first step or a certain mode selected in the interrupt processing (see S3 in FIG. 13A).

When the first mode is selected, the image data V is displayed on the display portion 230 in a predetermined period, for example.

When the second mode is selected, the operation of the display portion 230 is stopped, for example.

Thus, when a predetermined event is supplied, the image data V can be displayed on the display portion 230 in the predetermined period. Alternatively, when the predetermined event is not supplied, the operation of the display portion 230 can be stopped.

<<Fourth Step>>

In a fourth step, the next step is determined as follows: a fifth step is selected when a termination instruction has been supplied, whereas the third step is selected when the termination instruction has not been supplied (see S4 in FIG. 13A).

Note that in the interrupt processing, for example, the termination instruction can be supplied.

<<Fifth Step>>

In the fifth step, the program terminates (S5 in FIG. 13A).

The interrupt processing includes sixth to ninth steps described below (see FIG. 13B).

<<Sixth Step>>

In the sixth step, the processing proceeds to the seventh step when a predetermined event has been supplied, whereas the processing proceeds to the eighth step when the predetermined event has not been supplied (see S6 in FIG. 13B).

For example, whether the predetermined event is supplied in a predetermined period or not can be a branch condition. Specifically, the predetermined period can be shorter than or equal to 5 seconds, preferably shorter than 1 second, further preferably shorter than 0.5 second, and still further preferably shorter than or equal to 0.1 second.

For example, the predetermined event can include an event associated with the termination instruction.

<<Seventh Step>>

In the seventh step, the mode is changed (see S7 in FIG. 13B). Specifically, the mode is changed to the second mode when the first mode has been selected, or the mode is changed to the first mode when the second mode has been selected.

<<Eighth Step>>

In the eighth step, the interrupt processing terminates (see S8 in FIG. 13B).

<<Predetermined Event>>

For example, the following events can be used as the predetermined event: events such as a click and drag supplied using a button or the like of the input portion 240.

Alternatively, as the predetermined event, events such as tap, drag, and swipe can be used on the basis of the positional data P1 supplied using a finger or the like as a pointer from a touch panel or the like of the input portion 240.

Further alternatively, the data P2 that satisfies predetermined conditions, which is supplied from the sensor portion 250, can be used as the predetermined event.

The following instructions can be associated with the predetermined event, for example: "page-turning instruction" for switching displayed image data from one to another and "scroll instruction" for moving the display position of part of image data and displaying another part continuing from that part.

For example, the position of a slide bar pointed by a pointer, the swipe speed, or the drag speed can be used as parameters assigned to various instructions.

Specifically, for example, a parameter that determines the page-turning speed can be used to execute the "page-turning instruction" and a parameter that determines the moving speed of the display position can be used to execute the "scroll instruction."

Image information may be generated based on the pulse or the like of the user of the data processor, the usage ambience of the data processor, or the like acquired by the sensor portion 250. For example, a background of image data in accordance with user's preference can be determined by acquiring the ambient brightness or the like. Thus, favorable environment can be provided for the user of the data processor 200.

This embodiment can be combined with any of the other embodiments in this specification as appropriate.

Embodiment 8

In this embodiment, a semiconductor device (memory device) that can retain stored data even when not powered and that has an unlimited number of write cycles, and a CPU including the semiconductor device will be described. The CPU described in this embodiment can be used for the data processor described in Embodiment 6, for example.

<Memory Device>

Figure 14A:
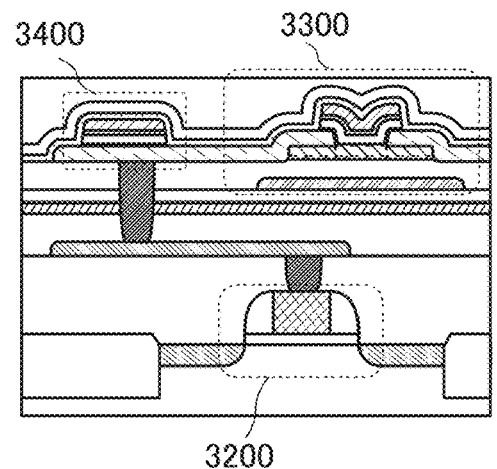
FIG. 14A is a cross-sectional view and FIGS. 14B and 14C are circuit diagrams each illustrating the structure of a semiconductor device of one embodiment.
Figure 14B:
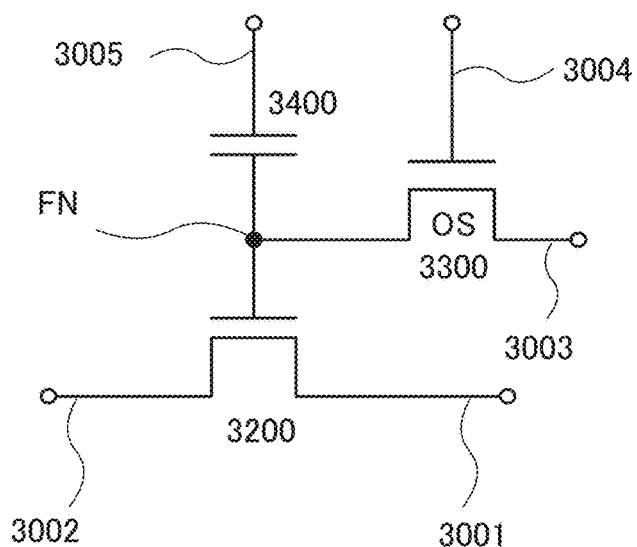
Figure 14C:
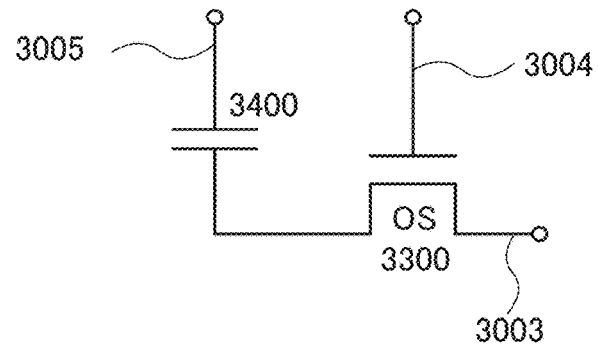

An example of a semiconductor device (memory device) which can retain stored data even when not powered and which has an unlimited number of write cycles is shown in FIGS. 14A to 14C. Note that FIG. 14B is a circuit diagram of the structure in FIG. 14A.

The semiconductor device illustrated in FIGS. 14A and 14B includes a transistor 3200 using a first semiconductor material, a transistor 3300 using a second semiconductor material, and a capacitor 3400.

The first and second semiconductor materials preferably have different energy gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor using an oxide semiconductor has a low off-state current.

The transistor 3300 is a transistor in which a channel is formed in a semiconductor layer including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 14B, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 14A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely small, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. On the other hand, in the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, it is necessary that data of a desired memory cell is read. For example, the fifth wiring 3005 of memory cells from which data is not read may be supplied with a potential at which the transistor 3200 is turned off regardless of the potential supplied to the gate electrode, that is, a potential lower than $V_{th\_H}$, whereby only data of a desired memory cell can be read. Alternatively, the fifth wiring 3005 of the memory cells from which data is not read may be supplied with a potential at which the transistor 3200 is turned on regardless of the potential supplied to the gate electrode, that is, a potential higher than $V_{th\_L}$, whereby only data of a desired memory cell can be read.

The semiconductor device illustrated in FIG. 14C is different from the semiconductor device illustrated in FIG. 14A in that the transistor 3200 is not provided. Also in this case, writing and retaining operation of data can be performed in a manner similar to the above.

Next, reading of data of the semiconductor device illustrated in FIG. 14C is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely small off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike a conventional nonvolatile memory, for example, it is not necessary to inject and extract electrons into and from a floating gate; thus, a problem such as deterioration of a gate insulating film is not caused. That is, the semiconductor device described in this embodiment does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

The above memory device can also be used in an LSI such as a digital signal processor (DSP), a custom LSI, or a programmable logic device (PLD), and a radio frequency identification (RF-ID), in addition to a central processing unit (CPU), for example.

<CPU>

A CPU including the above memory device is described below.

Figure 15:
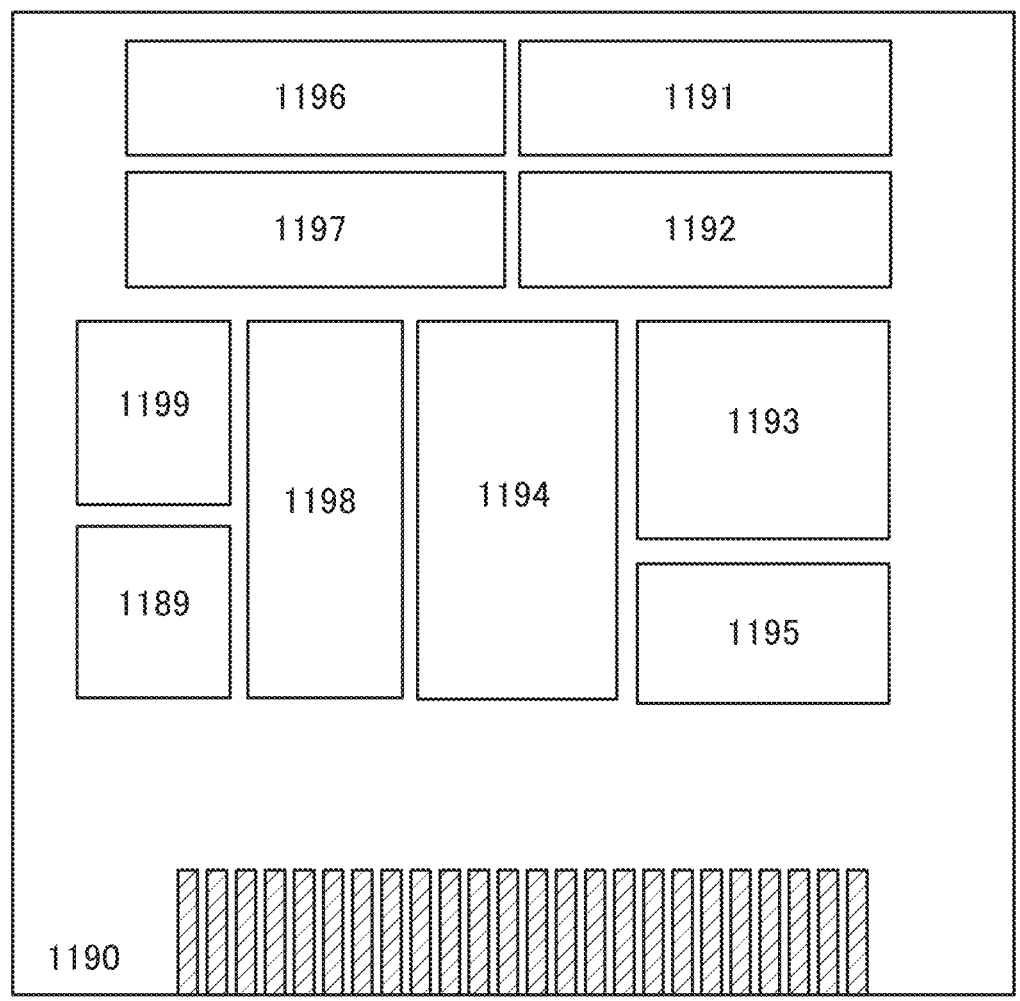
FIG. 15 is a block diagram illustrating the structure of a CPU of one embodiment.

FIG. 15 is a block diagram illustrating a configuration example of the CPU including the above memory device.

The CPU illustrated in FIG. 15 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 15 is just an example in which the configuration is simplified, and an actual CPU may have a variety of configurations depending on the application. For example, the CPU may have the following configuration: a structure including the CPU illustrated in FIG. 15 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 15, a memory cell is provided in the register 1196.

In the CPU illustrated in FIG. 15, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

Figure 16:
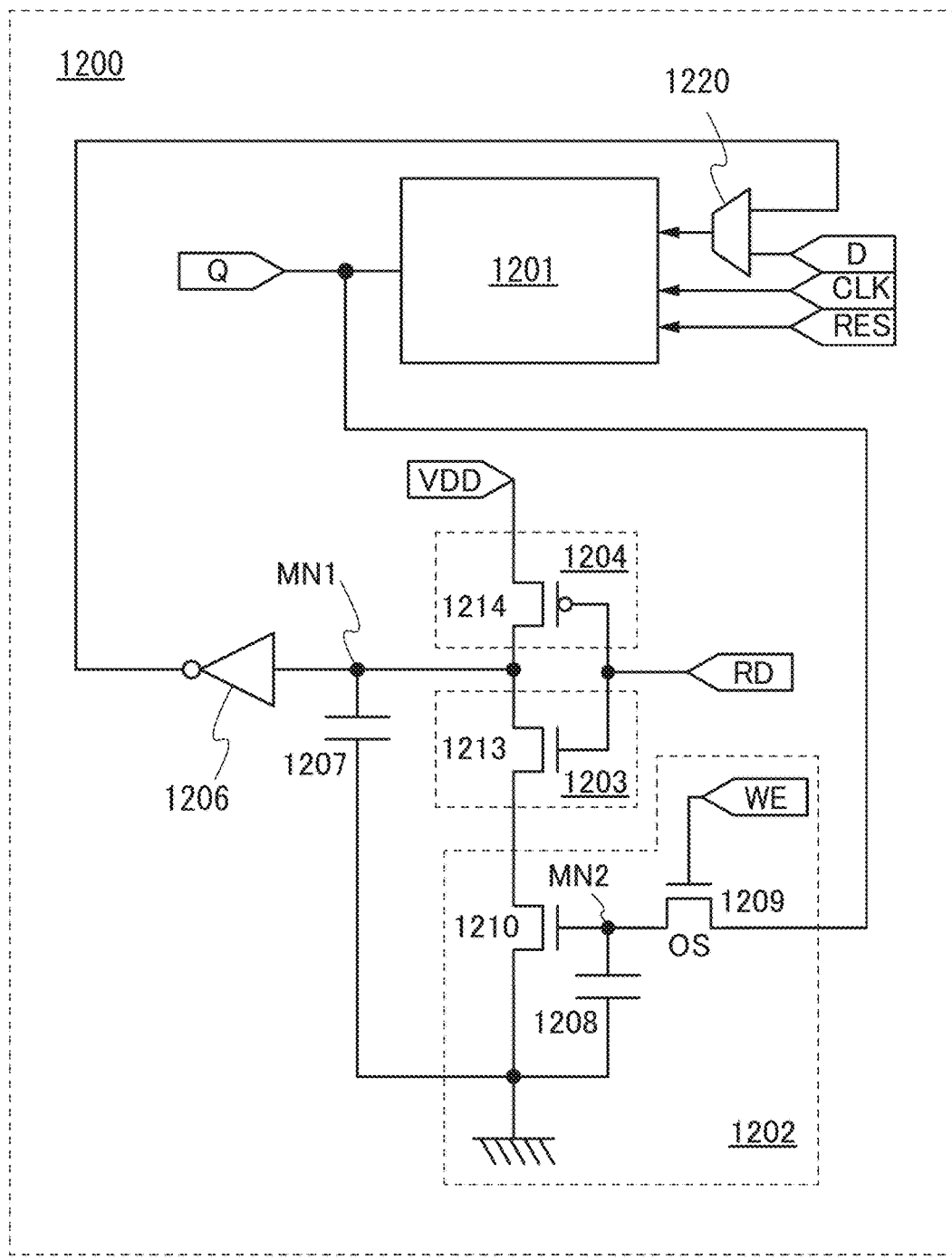
FIG. 16 is a circuit diagram illustrating the structure of a memory element of one embodiment.

FIG. 16 is an example of a circuit diagram of a memory element that can be used for the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node MN2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node MN1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 16 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 16, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 16, the transistors included in the memory element 1200 except for the transistor 1209 each can be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor film can be used for all the transistors in the memory element 1200. Further alternatively, in the memory element 1200, a transistor in which a channel is formed in an oxide semiconductor film can be included besides the transistor 1209, and a transistor in which a channel is formed in a layer formed using a semiconductor other than an oxide semiconductor or in the substrate 1190 can be used for the rest of the transistors.

As the circuit 1201 in FIG. 16, for example, a flip-flop circuit can be used. As the logic element 1206, for example, an inverter or a clocked inverter can be used.

In a period during which the memory element 1200 is not supplied with the power supply voltage, the semiconductor device described in this embodiment can retain data stored in the circuit 1201 by the capacitor 1208 that is provided in the circuit 1202.

The off-state current of a transistor in which a channel is formed in an oxide semiconductor film is extremely small. For example, the off-state current of a transistor in which a channel is formed in an oxide semiconductor film is significantly smaller than that of a transistor in which a channel is formed in silicon having crystallinity. Thus, when the transistor in which a channel is formed in an oxide semiconductor film is used as the transistor 1209, a signal is retained in the capacitor 1208 for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory element 1200 is restarted, the state (the on state or the off state) of the transistor 1210 is determined on the basis of the signal retained by the capacitor 1208 and can be read from the circuit 1202. Consequently, an original signal can be accurately read even when a potential corresponding to the signal retained by the capacitor 1208 changes to some degree.

By using the above-described memory element 1200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

At least part of this embodiment can be implemented in combination with any of the other embodiments described in this specification as appropriate.

Embodiment 9

In this embodiment, electronic devices including an input/output panel of one embodiment of the present invention will be described with reference to FIGS. 17A to 17H.

FIGS. 17A to 17H illustrate electronic devices. These electronic devices can include a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 17A:
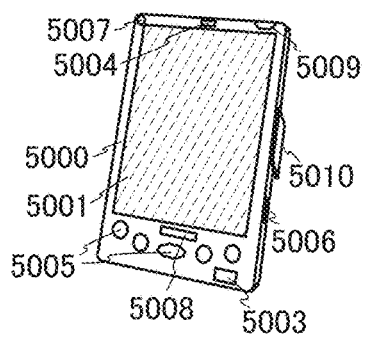
FIGS. 17A to 17H each illustrate the structure of an electronic device of one embodiment.
Figure 17B:
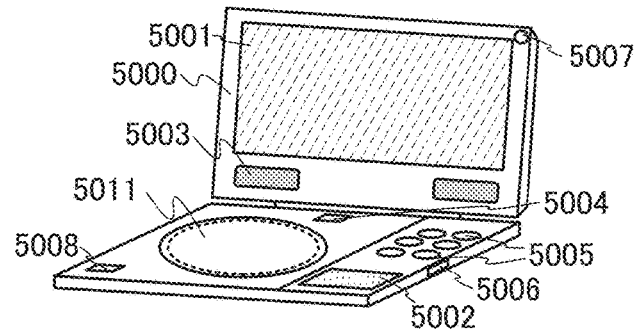
Figure 17C:
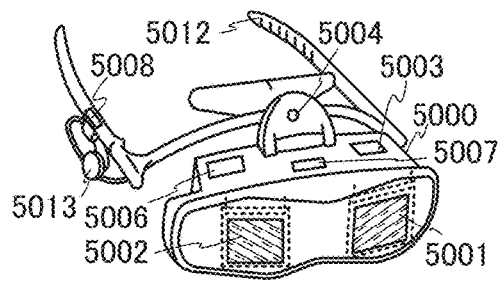
Figure 17D:
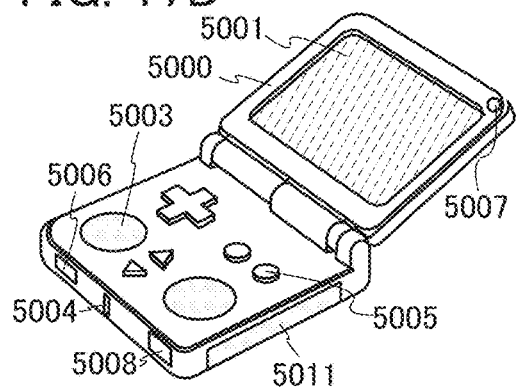
Figure 17E:
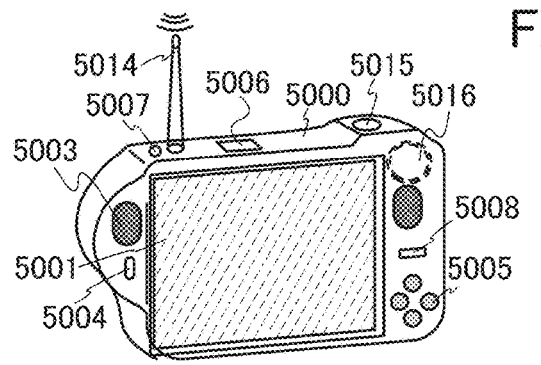
Figure 17F:
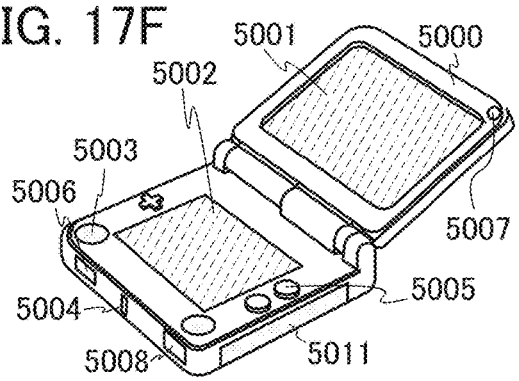
Figure 17G:
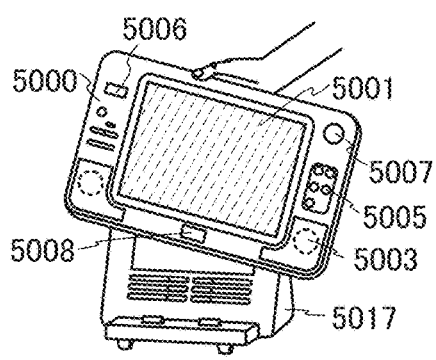

FIG. 17A illustrates a mobile computer, which can include a switch 5009, an infrared port 5010, and the like in addition to the above components. FIG. 17B illustrates a portable image reproducing device (e.g., a DVD reproducing device) provided with a recording medium, and the portable image reproducing device can include a second display portion 5002, a recording medium reading portion 5011, and the like in addition to the above components. FIG. 17C illustrates a goggle-type display, which can include the second display portion 5002, a support portion 5012, an earphone 5013, and the like in addition to the above components. FIG. 17D illustrates a portable game console, which can include the recording medium reading portion 5011 and the like in addition to the above components. FIG. 17E illustrates a digital camera with a television reception function, and the digital camera can include an antenna 5014, a shutter button 5015, an image receiving portion 5016, and the like in addition to the above components. FIG. 17F illustrates a portable game console, which can include the second display portion 5002, the recording medium reading portion 5011, and the like in addition to the above components. FIG. 17G illustrates a portable television receiver, which can include a charger 5017 capable of transmitting and receiving signals, and the like in addition to the above components.

The electronic devices in FIGS. 17A to 17G can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image data mainly on one display portion while displaying text data mainly on another display portion, a function of displaying a three-dimensional image by displaying images on a plurality of display portions with a parallax taken into account, or the like. Furthermore, the electronic device including an image receiving portion can have a function of shooting a still image, a function of taking moving images, a function of automatically or manually correcting a shot image, a function of storing a shot image in a recording medium (an external recording medium or a recording medium incorporated in the camera), a function of displaying a shot image on the display portion, or the like.

Note that functions of the electronic devices in FIGS. 17A to 17G are not limited thereto, and the electronic devices can have a variety of functions.

Figure 17H:
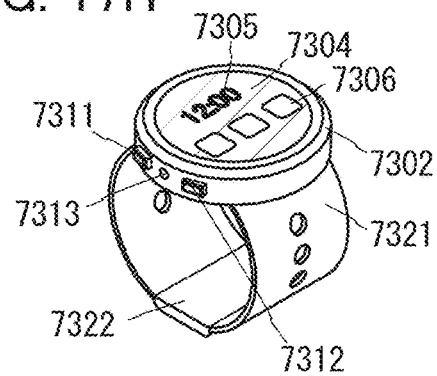

FIG. 17H illustrates a smart watch, which includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 may have a rectangular display region. The display panel 7304 can display an icon 7305 indicating time, another icon 7306, and the like.

The smart watch in FIG. 17H can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting element for the display panel 7304.

This embodiment can be combined with any of the other embodiments in this specification as appropriate.

In this specification and the like, for example, when it is explicitly described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X and Y each denote an object (e.g., a device, an element, a circuit, a wiring, an electrode, a terminal, a conductive film, or a layer).

For example, in the case where X and Y are directly connected, an element that enables electrical connection between X and Y (e.g., a switch, a transistor, a capacitor, an inductor, a resistor, a diode, a display element, a light-emitting element, or a load) is not connected between X and Y, and X and Y are connected without the element that enables electrical connection between X and Y (e.g., a switch, a transistor, a capacitor, an inductor, a resistor, a diode, a display element, a light-emitting element, or a load) provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application serial no. 2015-179183 filed with Japan Patent Office on Sep. 11, 2015, the entire contents of which are hereby incorporated by reference.

What is claimed is:

1. An input/output panel comprising:
    a display element comprising:
        a first electrode; and
        a second electrode comprising a first region and a second region;
    a first transistor over the display element, the first transistor comprising:
        a gate electrode; and
        source and drain electrodes, one of the source and drain electrodes electrically connected to the display element;
    a first conductive film electrically connected to the other of the source and drain electrodes of the first transistor; and
    a second conductive film which is configured to form an electric field between the first conductive film and the second conductive film,
    wherein the electric field is partly interrupted by an object approaching a region overlapping with the display element,
    wherein the first region and the first conductive film overlap each other,
    wherein the second region and the second conductive film overlap each other, and
    wherein the first electrode and the second electrode of the display element overlap each other.

2. The input/output panel according to claim 1, wherein the second conductive film has a light-transmitting region in a region overlapping with the first electrode of the display element.

3. The input/output panel according to claim 1, further comprising:
    a first plurality of pixel circuits arranged in a row direction;
    a second plurality of pixel circuits arranged in a column direction intersecting;
    a scan line electrically connected to the first plurality of pixel circuits arranged in the row direction; and
    a signal line electrically connected to the second plurality of pixel circuits arranged in the column direction,
    wherein the first conductive film is electrically connected to the first plurality of pixel circuits arranged in the row direction and the second plurality of pixel circuits arranged in the column direction, and
    wherein the display element is electrically connected to one of the first plurality of pixel circuits and the second plurality of pixel circuits.

4. The input/output panel according to claim 3, wherein the first conductive film further comprises a plurality of conductive films extending in the row direction.

5. The input/output panel according to claim 1,
    wherein the display element further comprises a layer comprising a light-emitting organic compound between the first electrode and the second electrode of the display element,
    wherein the first electrode of the display element has a light-transmitting region in a region overlapping with the second electrode of the display element, and
    wherein the second electrode of the display element has a region interposing one of the first conductive film and the second conductive film between the second electrode of the display element and the other of the first conductive film and the second conductive film.

6. The input/output panel according to claim 3,
    wherein the first plurality of pixel circuits each comprise:
        the first transistor;

a second transistor comprising:
  a gate electrode electrically connected to the scan line; and
    source and drain electrodes, one of the source and drain electrodes electrically connected to the scan line and the other of the source and drain electrodes electrically connected to the gate electrode of the first transistor; and
  a capacitor comprising:
    a first electrode electrically connected to the gate electrode of the first transistor; and
    a second electrode electrically connected to the one of the source and drain electrodes of the first transistor.

7. The input/output panel according to claim 6,
wherein each of the first transistor and the second transistor further comprises a semiconductor film, and
wherein the semiconductor film comprises indium, gallium, zinc and oxygen.

8. The input/output panel according to claim 1, wherein the second conductive film comprises indium, gallium, zinc and oxygen.

9. An input/output device comprising:
the input/output panel according to claim 1; and
a driver circuit electrically connected to the input/output panel,
wherein the driver circuit is configured to supply a search signal to one of the first conductive film and the second conductive film, and
wherein the driver circuit is configured to generate a sensor signal on the basis of a potential supplied from the other of the first conductive film and the second conductive film.

10. A data processor comprising:
an arithmetic device configured to receive positional data and external data and supply image data and control data; and
the input/output device according to claim 9,
wherein the input/output device is configured to supply the positional data and the external data and is configured to receive the image data and the control data,
wherein the arithmetic device is further configured to generate the image data on the basis of the external data and is configured to determine and supply the control data on the basis of the positional data, and
wherein the input/output device further comprises:
  a display portion configured to display the image data;
  an input portion configured to supply the positional data; and
  a communication portion configured to receive the external data and configured to send the control data.

11. The data processor according to claim 10, wherein the input portion comprises at least one of a keyboard, a hardware button, a pointing device, a touch sensor, an illuminance sensor, an imaging device, an audio input device, a viewpoint input device and a pose detection device.

12. An input/output panel comprising:
a display element comprising:
  a first electrode;
  a first layer over the first electrode, the first layer comprising a light-emitting compound; and
  a second electrode over the first layer; and
a first transistor over the display element, the first transistor comprising:
  a gate electrode; and
  source and drain electrodes, one of the source and drain electrodes electrically connected to the second electrode of the display element;
a touch sensor comprising:
  a first conductive film over the second electrode of the display element, the first conductive film electrically connected to the other of the source and drain electrodes of the first transistor; and
  a second conductive film over the first electrode of the display element,
wherein one of the first electrode and the second electrode of the display element has a light-transmitting property.

13. The input/output panel according to claim 12, wherein the first conductive film is in direct contact with the other of the source and drain electrodes of the first transistor.

14. The input/output panel according to claim 12, further comprising:
a pixel circuit comprising:
  the first transistor;
  a second transistor comprising:
    a gate electrode electrically connected to a first line; and
    source and drain electrodes, one of the source and drain electrodes electrically connected to a second line and the other of the source and drain electrodes electrically connected to the gate electrode of the first transistor; and
  a capacitor comprising:
    a first electrode electrically connected to the gate electrode of the first transistor; and
    a second electrode electrically connected to the one of the source and drain electrodes of the first transistor.

15. The input/output panel according to claim 14,
wherein the first line is a scan line, and
wherein the second line is a signal line.

16. The input/output panel according to claim 14, wherein each of a channel region of the first transistor and a channel region of the second transistor comprises indium, zinc and oxygen.

17. The input/output panel according to claim 14, wherein each of a channel region of the first transistor, a channel region of the second transistor, and the second conductive film comprises indium, zinc and oxygen.

18. An input/output device comprising:
the input/output panel according to claim 12; and
a driver circuit electrically connected to the input/output panel,
wherein the driver circuit is configured to supply a search signal to one of the first conductive film and the second conductive film, and
wherein the driver circuit is configured to generate a sensor signal on the basis of a potential supplied from the other of the first conductive film and the second conductive film.

19. A data processor comprising:
an arithmetic device configured to receive positional data and external data and supply image data and control data; and
the input/output device according to claim 18,
wherein the input/output device is configured to supply the positional data and the external data and receive the image data and the control data, wherein the arithmetic device is further configured to generate the image data on the basis of the external data and determine and supply the control data on the basis of the positional data, and wherein the input/output device further comprises:
a display portion;
an input portion; and
a communication portion,
wherein the display portion is configured to display the image data,
wherein the input portion is configured to supply the positional data, and
wherein the communication portion is configured to receive the external data and send the control data.

20. The data processor according to claim 19, wherein the input portion comprises at least one of a keyboard, a hardware button, a pointing device, an illuminance sensor, an imaging device, an audio input device, a viewpoint input device and a pose detection device.

* * * * *